US010386511B2

(12) United States Patent
Routh et al.

(10) Patent No.: US 10,386,511 B2
(45) Date of Patent: Aug. 20, 2019

(54) SEISMIC SURVEY DESIGN USING FULL WAVEFIELD INVERSION

(71) Applicants: Partha S. Routh, Katy, TX (US); Nathan Downey, Houston, TX (US); Christine E. Krohn, Houston, TX (US)

(72) Inventors: Partha S. Routh, Katy, TX (US); Nathan Downey, Houston, TX (US); Christine E. Krohn, Houston, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 836 days.

(21) Appl. No.: 14/797,654

(22) Filed: Jul. 13, 2015

(65) Prior Publication Data
US 2016/0097870 A1    Apr. 7, 2016

Related U.S. Application Data

(60) Provisional application No. 62/059,541, filed on Oct. 3, 2014.

(51) Int. Cl.
*G01V 1/00*    (2006.01)
*G01V 1/28*    (2006.01)
(Continued)

(52) U.S. Cl.
CPC .............. *G01V 1/282* (2013.01); *G01V 1/003* (2013.01); *G01V 1/3808* (2013.01); *G01V 1/00* (2013.01);
(Continued)

(58) Field of Classification Search
None
See application file for complete search history.

(56) References Cited

U.S. PATENT DOCUMENTS 3,812,457 A    5/1974 Weller
3,864,667 A    2/1975 Bahjat
(Continued)

FOREIGN PATENT DOCUMENTS

CA    2 796 631    11/2011
EP    1 094 338    4/2001
(Continued)

OTHER PUBLICATIONS

R. Miller and P. S. Routh, "Resolution analysis of geophysical images: Comparison between point spread function and region of data influence measures" 835-852, 2007.*
(Continued)

*Primary Examiner* — Kibrom K Gebresilassie
(74) *Attorney, Agent, or Firm* — ExxonMobil Upstream Research Company-Law Department

(57) ABSTRACT

Method for selecting an acquisition geometry for a seismic survey based on ability to resolve an a priori velocity model. Two or more candidate acquisition geometries are selected (301, 302), differing in areal coverage and cost to perform. Then compute a synthetic seismic dataset for each geometry using a detailed geometrical reference model of the subsurface (301). Invert the synthetic seismic datasets preferably using simultaneous source FWI, and preferably with Volume of Investigation constraints, to determine model updates (303, 304). Quantitatively assess the value of the additional traces in a fuller dataset relative to a subset (306), using one or more statistics based on the accuracy of the updated models, such as improved match to the reference model, better fit of seismic data, or rate of change in improvement with iterations. Inversions may be cascaded for further efficiency (314).

14 Claims, 7 Drawing Sheets

(51) Int. Cl.
*G01V 1/38* (2006.01)
*G06F 17/17* (2006.01)
*G06F 17/50* (2006.01)

(52) U.S. Cl.
CPC .... *G01V 2200/14* (2013.01); *G01V 2210/614* (2013.01); *G01V 2210/667* (2013.01); *G01V 2210/67* (2013.01); *G01V 2210/679* (2013.01); *G06F 17/17* (2013.01); *G06F 17/5009* (2013.01); *G06T 2207/20064* (2013.01)

(56) References Cited

U.S. PATENT DOCUMENTS

| | | | |
|---|---|---|---|
| 4,159,463 A | 6/1979 | Silverman | |
| 4,168,485 A | 9/1979 | Payton et al. | |
| 4,486,863 A * | 12/1984 | French | G01V 1/3808 367/117 |
| 4,545,039 A | 10/1985 | Savit | |
| 4,562,650 A | 1/1986 | Nagasawa et al. | |
| 4,575,830 A | 3/1986 | Ingram et al. | |
| 4,594,662 A | 6/1986 | Devaney | |
| 4,636,957 A | 1/1987 | Vannier et al. | |
| 4,675,851 A | 6/1987 | Savit et al. | |
| 4,686,654 A | 8/1987 | Savit | |
| 4,707,812 A | 11/1987 | Martinez | |
| 4,715,020 A | 12/1987 | Landrum, Jr. | |
| 4,766,574 A | 8/1988 | Whitmore et al. | |
| 4,780,856 A | 10/1988 | Becquey | |
| 4,823,326 A | 4/1989 | Ward | |
| 4,924,390 A | 5/1990 | Parsons et al. | |
| 4,953,657 A | 9/1990 | Edington | |
| 4,969,129 A | 11/1990 | Currie | |
| 4,982,374 A | 1/1991 | Edington et al. | |
| 5,260,911 A | 11/1993 | Mason et al. | |
| 5,469,062 A | 11/1995 | Meyer, Jr. | |
| 5,583,825 A | 12/1996 | Carrazzone et al. | |
| 5,677,893 A * | 10/1997 | de Hoop | G01V 1/28 367/38 |
| 5,715,213 A | 2/1998 | Allen | |
| 5,717,655 A | 2/1998 | Beasley | |
| 5,719,821 A | 2/1998 | Sallas et al. | |
| 5,721,710 A | 2/1998 | Sallas et al. | |
| 5,790,473 A | 8/1998 | Allen | |
| 5,798,982 A | 8/1998 | He et al. | |
| 5,822,269 A | 10/1998 | Allen | |
| 5,838,634 A | 11/1998 | Jones et al. | |
| 5,852,588 A | 12/1998 | de Hoop et al. | |
| 5,878,372 A | 3/1999 | Tabarovsky et al. | |
| 5,920,838 A | 7/1999 | Norris et al. | |
| 5,924,049 A | 7/1999 | Beasley et al. | |
| 5,999,488 A | 12/1999 | Smith | |
| 5,999,489 A | 12/1999 | Lazaratos | |
| 6,014,342 A | 1/2000 | Lazaratos | |
| 6,021,094 A | 2/2000 | Ober et al. | |
| 6,028,818 A | 2/2000 | Jeffryes | |
| 6,058,073 A | 5/2000 | VerWest | |
| 6,125,330 A | 9/2000 | Robertson et al. | |
| 6,219,621 B1 | 4/2001 | Hornbostel | |
| 6,225,803 B1 | 5/2001 | Chen | |
| 6,311,133 B1 | 10/2001 | Lailly et al. | |
| 6,317,695 B1 | 11/2001 | Zhou et al. | |
| 6,327,537 B1 | 12/2001 | Ikelle | |
| 6,374,201 B1 | 4/2002 | Grizon et al. | |
| 6,381,543 B1 | 4/2002 | Guerillot et al. | |
| 6,388,947 B1 | 5/2002 | Washbourne et al. | |
| 6,480,790 B1 | 11/2002 | Calvert et al. | |
| 6,522,973 B1 | 2/2003 | Tonellot et al. | |
| 6,545,944 B2 | 4/2003 | de Kok | |
| 6,549,854 B1 | 4/2003 | Malinverno et al. | |
| 6,574,564 B2 | 6/2003 | Lailly et al. | |
| 6,593,746 B2 | 7/2003 | Stolarczyk | |
| 6,662,147 B1 | 12/2003 | Fournier et al. | |
| 6,665,615 B2 | 12/2003 | Van Riel et al. | |
| 6,687,619 B2 | 2/2004 | Moerig et al. | |
| 6,687,659 B1 | 2/2004 | Shen | |
| 6,691,075 B1 * | 2/2004 | Winbow | G01V 1/282 367/14 |
| 6,704,245 B2 | 3/2004 | Becquey | |
| 6,714,867 B2 | 3/2004 | Meunier | |
| 6,735,527 B1 | 5/2004 | Levin | |
| 6,754,590 B1 | 6/2004 | Moldoveanu | |
| 6,766,256 B2 | 7/2004 | Jeffryes | |
| 6,826,486 B1 | 11/2004 | Malinverno | |
| 6,836,448 B2 | 12/2004 | Robertsson et al. | |
| 6,842,701 B2 | 1/2005 | Moerig et al. | |
| 6,859,734 B2 | 2/2005 | Bednar | |
| 6,865,487 B2 | 3/2005 | Charron | |
| 6,865,488 B2 | 3/2005 | Moerig et al. | |
| 6,876,928 B2 | 4/2005 | Van Riel et al. | |
| 6,882,938 B2 | 4/2005 | Vaage et al. | |
| 6,882,958 B2 | 4/2005 | Schmidt et al. | |
| 6,901,333 B2 | 5/2005 | Van Riel et al. | |
| 6,903,999 B2 * | 6/2005 | Curtis | G01V 1/20 367/11 |
| 6,905,916 B2 | 6/2005 | Bartsch et al. | |
| 6,906,981 B2 | 6/2005 | Vauge | |
| 6,927,698 B2 | 8/2005 | Stolarczyk | |
| 6,944,546 B2 | 9/2005 | Xiao et al. | |
| 6,947,843 B2 | 9/2005 | Fisher et al. | |
| 6,970,397 B2 | 11/2005 | Castagna et al. | |
| 6,977,866 B2 | 12/2005 | Huffman et al. | |
| 6,999,880 B2 | 2/2006 | Lee | |
| 7,046,581 B2 | 5/2006 | Calvert | |
| 7,050,356 B2 | 5/2006 | Jeffryes | |
| 7,069,149 B2 | 6/2006 | Goff et al. | |
| 7,027,927 B2 | 7/2006 | Routh et al. | |
| 7,072,767 B2 | 7/2006 | Routh et al. | |
| 7,092,823 B2 | 8/2006 | Lailly et al. | |
| 7,110,900 B2 | 9/2006 | Adler et al. | |
| 7,184,367 B2 | 2/2007 | Yin | |
| 7,230,879 B2 | 6/2007 | Herkenoff et al. | |
| 7,271,747 B2 | 9/2007 | Baraniuk et al. | |
| 7,330,799 B2 | 2/2008 | Lefebvre et al. | |
| 7,336,560 B2 | 2/2008 | Rekdal et al. | |
| 7,337,069 B2 | 2/2008 | Masson et al. | |
| 7,373,251 B2 | 5/2008 | Hamman et al. | |
| 7,373,252 B2 | 5/2008 | Sherrill et al. | |
| 7,376,046 B2 | 5/2008 | Jeffryes | |
| 7,376,539 B2 | 5/2008 | Lecomte | |
| 7,400,978 B2 | 7/2008 | Langlais et al. | |
| 7,436,734 B2 | 10/2008 | Krohn | |
| 7,480,206 B2 | 1/2009 | Hill | |
| 7,584,056 B2 * | 9/2009 | Koren | G01V 1/28 175/50 |
| 7,599,798 B2 | 10/2009 | Beasley et al. | |
| 7,602,670 B2 | 10/2009 | Jeffryes | |
| 7,616,523 B1 | 11/2009 | Tabti et al. | |
| 7,620,534 B2 | 11/2009 | Pita et al. | |
| 7,620,536 B2 | 11/2009 | Chow | |
| 7,646,924 B2 | 1/2010 | Donoho | |
| 7,672,194 B2 | 3/2010 | Jeffryes | |
| 7,672,824 B2 | 3/2010 | Dutta et al. | |
| 7,675,815 B2 | 3/2010 | Saenger et al. | |
| 7,679,990 B2 | 3/2010 | Herkenhoff et al. | |
| 7,684,281 B2 | 3/2010 | Vaage et al. | |
| 7,689,396 B2 | 3/2010 | Campbell | |
| 7,710,821 B2 | 5/2010 | Robertsson et al. | |
| 7,715,985 B2 | 5/2010 | Van Manen et al. | |
| 7,715,986 B2 | 5/2010 | Nemeth et al. | |
| 7,725,266 B2 | 5/2010 | Sirgue et al. | |
| 7,791,980 B2 | 9/2010 | Robertsson et al. | |
| 7,835,072 B2 | 11/2010 | Izumi | |
| 7,840,625 B2 | 11/2010 | Candes et al. | |
| 7,940,601 B2 | 5/2011 | Ghosh | |
| 8,121,823 B2 | 2/2012 | Krebs et al. | |
| 8,248,886 B2 | 8/2012 | Neelamani et al. | |
| 8,428,925 B2 | 4/2013 | Krebs et al. | |
| 8,437,998 B2 | 5/2013 | Routh et al. | |
| 8,547,794 B2 | 10/2013 | Gulati et al. | |
| 8,688,381 B2 | 4/2014 | Routh et al. | |
| 8,775,143 B2 * | 7/2014 | Routh | G01V 1/28 703/10 |
| 8,781,748 B2 | 7/2014 | Laddoch et al. | |

(56) References Cited

U.S. PATENT DOCUMENTS

| | | | |
|---|---|---|---|
| 8,892,413 B2* | 11/2014 | Routh | G01V 1/28 |
| | | | 702/6 |
| 2002/0099504 A1 | 7/2002 | Cross et al. | |
| 2002/0120429 A1 | 8/2002 | Ortoleva | |
| 2002/0183980 A1 | 12/2002 | Guillaume | |
| 2003/0060981 A1* | 3/2003 | Routh | G01V 1/30 |
| | | | 702/14 |
| 2003/0193837 A1* | 10/2003 | Rommel | G01V 1/003 |
| | | | 367/37 |
| 2004/0199330 A1 | 10/2004 | Routh et al. | |
| 2004/0225438 A1 | 11/2004 | Okoniewski et al. | |
| 2006/0235666 A1 | 10/2006 | Assa et al. | |
| 2007/0036030 A1 | 2/2007 | Baumel et al. | |
| 2007/0038691 A1 | 2/2007 | Candes et al. | |
| 2007/0274155 A1 | 11/2007 | Ikelle | |
| 2008/0175101 A1 | 7/2008 | Saenger et al. | |
| 2008/0306692 A1 | 12/2008 | Singer et al. | |
| 2009/0006054 A1 | 1/2009 | Song | |
| 2009/0067041 A1 | 3/2009 | Krauklis et al. | |
| 2009/0070042 A1 | 3/2009 | Birchwood et al. | |
| 2009/0083006 A1 | 3/2009 | Mackie | |
| 2009/0164186 A1 | 6/2009 | Haase et al. | |
| 2009/0164756 A1 | 6/2009 | Dokken et al. | |
| 2009/0187391 A1 | 7/2009 | Wendt et al. | |
| 2009/0248308 A1 | 10/2009 | Luling | |
| 2009/0254320 A1 | 10/2009 | Lovatini et al. | |
| 2009/0259406 A1 | 10/2009 | Khadhraoui et al. | |
| 2010/0008184 A1 | 1/2010 | Hegna et al. | |
| 2010/0018718 A1 | 1/2010 | Krebs et al. | |
| 2010/0039894 A1 | 2/2010 | Abma et al. | |
| 2010/0054082 A1 | 3/2010 | McGarry et al. | |
| 2010/0088035 A1 | 4/2010 | Etgen et al. | |
| 2010/0103772 A1 | 4/2010 | Eick et al. | |
| 2010/0118651 A1 | 5/2010 | Liu et al. | |
| 2010/0142316 A1 | 6/2010 | Keers et al. | |
| 2010/0161233 A1 | 6/2010 | Saenger et al. | |
| 2010/0161234 A1 | 6/2010 | Saenger et al. | |
| 2010/0185422 A1* | 7/2010 | Hoversten | G01V 11/00 |
| | | | 703/2 |
| 2010/0208554 A1 | 8/2010 | Chiu et al. | |
| 2010/0212902 A1 | 8/2010 | Baumstein et al. | |
| 2010/0246324 A1 | 9/2010 | Dragoset, Jr. et al. | |
| 2010/0265797 A1 | 10/2010 | Robertsson et al. | |
| 2010/0270026 A1 | 10/2010 | Lazaratos et al. | |
| 2010/0286919 A1 | 11/2010 | Lee et al. | |
| 2010/0299070 A1 | 11/2010 | Abma | |
| 2011/0000678 A1 | 1/2011 | Krebs et al. | |
| 2011/0040926 A1 | 2/2011 | Donderici et al. | |
| 2011/0051553 A1 | 3/2011 | Scott et al. | |
| 2011/0090760 A1 | 4/2011 | Rickett et al. | |
| 2011/0131020 A1 | 6/2011 | Meng | |
| 2011/0134722 A1 | 6/2011 | Virgilio et al. | |
| 2011/0182141 A1 | 7/2011 | Zhamikov et al. | |
| 2011/0182144 A1 | 7/2011 | Gray | |
| 2011/0191032 A1 | 8/2011 | Moore | |
| 2011/0194379 A1 | 8/2011 | Lee et al. | |
| 2011/0222370 A1 | 9/2011 | Downton et al. | |
| 2011/0227577 A1 | 9/2011 | Zhang et al. | |
| 2011/0235464 A1 | 9/2011 | Brittan et al. | |
| 2011/0238390 A1 | 9/2011 | Krebs et al. | |
| 2011/0246140 A1 | 10/2011 | Abubakar et al. | |
| 2011/0267921 A1* | 11/2011 | Mortel | G01V 1/28 |
| | | | 367/25 |
| 2011/0267923 A1 | 11/2011 | Shin | |
| 2011/0276320 A1 | 11/2011 | Krebs et al. | |
| 2011/0288831 A1 | 11/2011 | Tan et al. | |
| 2011/0299361 A1 | 12/2011 | Shin | |
| 2011/0320180 A1 | 12/2011 | Al-Saleh | |
| 2012/0010862 A1 | 1/2012 | Costen | |
| 2012/0014215 A1 | 1/2012 | Saenger et al. | |
| 2012/0014216 A1 | 1/2012 | Saenger et al. | |
| 2012/0051176 A1 | 3/2012 | Liu | |
| 2012/0073824 A1 | 3/2012 | Routh | |
| 2012/0073825 A1 | 3/2012 | Routh | |
| 2012/0082344 A1 | 4/2012 | Donoho | |
| 2012/0143506 A1 | 6/2012 | Routh et al. | |
| 2012/0215506 A1 | 8/2012 | Rickett et al. | |
| 2012/0218859 A1 | 8/2012 | Soubaras | |
| 2012/0275264 A1 | 11/2012 | Kostov et al. | |
| 2012/0275267 A1 | 11/2012 | Neelamani et al. | |
| 2012/0290214 A1 | 11/2012 | Huo et al. | |
| 2012/0300585 A1 | 11/2012 | Cao et al. | |
| 2012/0314538 A1 | 12/2012 | Washbourne et al. | |
| 2012/0316790 A1 | 12/2012 | Washbourne et al. | |
| 2012/0316844 A1 | 12/2012 | Shah et al. | |
| 2013/0060539 A1 | 3/2013 | Baumstein | |
| 2013/0077439 A1* | 3/2013 | Eick | G01V 1/003 |
| | | | 367/73 |
| 2013/0077440 A1* | 3/2013 | Cao | G01V 1/28 |
| | | | 367/73 |
| 2013/0081752 A1 | 4/2013 | Kurimura et al. | |
| 2013/0238246 A1* | 9/2013 | Krebs | G01V 1/005 |
| | | | 702/14 |
| 2013/0279290 A1 | 10/2013 | Poole | |
| 2013/0282292 A1 | 10/2013 | Wang et al. | |
| 2013/0311149 A1* | 11/2013 | Tang | G06F 17/50 |
| | | | 703/2 |
| 2013/0311151 A1* | 11/2013 | Plessix | G01V 1/30 |
| | | | 703/2 |
| 2014/0043939 A1* | 2/2014 | Vasconcelos | A61B 8/00 |
| | | | 367/73 |
| 2014/0129188 A1* | 5/2014 | Schultz | G01V 1/003 |
| | | | 703/2 |
| 2014/0200854 A1* | 7/2014 | Eggenberger | G01V 1/003 |
| | | | 702/189 |
| 2014/0350861 A1 | 11/2014 | Wang et al. | |
| 2014/0358504 A1 | 12/2014 | Baumstein et al. | |
| 2014/0372043 A1 | 12/2014 | Hu et al. | |
| 2017/0176613 A1* | 6/2017 | Burnett | G01V 1/003 |

FOREIGN PATENT DOCUMENTS

| | | |
|---|---|---|
| EP | 1 746 443 | 1/2007 |
| GB | 2 390 712 | 1/2004 |
| GB | 2 391 665 | 2/2004 |
| WO | WO 2004/025326 | 3/2004 |
| WO | WO 2006/037815 | 4/2006 |
| WO | WO 2007/046711 | 4/2007 |
| WO | WO 2008/042081 | 4/2008 |
| WO | WO 2008/123920 | 10/2008 |
| WO | WO 2009/067041 | 5/2009 |
| WO | WO 2009/117174 | 9/2009 |
| WO | WO 2010/085822 | 7/2010 |
| WO | WO 2011/040926 | 4/2011 |
| WO | WO 2011/091216 | 7/2011 |
| WO | WO 2011/093945 | 8/2011 |
| WO | WO 2012/024025 | 2/2012 |
| WO | WO 2012/041834 | 4/2012 |
| WO | WO 2012/083234 | 6/2012 |
| WO | WO 2012/134621 | 10/2012 |
| WO | WO 2012/170201 | 12/2012 |
| WO | WO 2013/081752 | 6/2013 |

OTHER PUBLICATIONS

C. R. Miller, and P. S. Routh, "Resolution analysis of geophysical images: Comparison between point spread function and region of data influence measures" pp. 835-852, 2006.*

Mora, P. (1987), "Elastic Wavefield Inversion," PhD Thesis, Stanford University, pp. 22-25.

Mora, P. (1989), "Inversion=migration+tomography," *Geophysics* 64, pp. 888-901.

Nazarian, S. et al. (1983), "Use of spectral analysis of surface waves method for determination of moduli and thickness of pavement systems," *Transport Res. Record* 930, pp. 38-45.

Neelamani, R., (2008), "Simultaneous sourcing without compromise," 70th Annual Int'l. Conf. and Exh., EAGE, 5 pgs.

Neelamani, R. (2009), "Efficient seismic forward modeling using simultaneous sources and sparsity," *SEG Expanded Abstracts*, pp. 2107-2111.

(56) References Cited

OTHER PUBLICATIONS

Nocedal, J. et al. (2006), "*Numerical Optimization, Chapt. 7—Large-Scale Unconstrained Optimization,*" Springer, New York, $2^{nd}$ Edition, pp. 165-176.
Nocedal, J. et al. (2000), "Numerical Optimization-Calculating Derivatives," Chapter 8, Springer Verlag, pp. 194-199.
Ostmo, S. et al. (2002), "Finite-difference iterative migration by linearized waveform inversion in the frequency domain," SEG Int'l. Expo. & $72^{nd}$ Ann. Meeting, 4 pgs.
Park, C.B. et al. (1999), "Multichannel analysis of surface waves," *Geophysics* 64(3), pp. 800-808.
Park, C.B. et al. (2007), "Multichannel analysis of surface waves (MASW)—active and passive methods," *The Leading Edge*, pp. 60-64.
Pica, A. et al. (2005), "3D Surface-Related Multiple Modeling, Principles and Results," 2005 SEG Ann. Meeting, *SEG Expanded Abstracts* 24, pp. 2080-2083.
Plessix, R.E. et al. (2004), "Frequency-domain finite-difference amplitude preserving migration," *Geophys. J. Int.* 157, pp. 975-987.
Porter, R.P. (1989), "Generalized holography with application to inverse scattering and inverse source problems," In E. Wolf, editor, Progress in Optics XXVII, Elsevier, pp. 317-397.
Pratt, R.G. et al. (1998), "Gauss-Newton and full Newton methods in frequency-space seismic waveform inversion," *Geophys. J. Int.* 133, pp. 341-362.
Pratt, R.G. (1999), "Seismic waveform inversion in the frequency domain, Part 1: Theory and verification in a physical scale model," *Geophysics* 64, pp. 888-901.
Rawlinson, N. et al. (2008), "A dynamic objective function technique for generating multiple solution models in seismic tomography," *Geophys. J. Int.* 178, pp. 295-308.
Rayleigh, J.W.S. (1899), "On the transmission of light through an atmosphere containing small particles in suspension, and on the origin of the blue of the sky," Phil. Mag. 47, pp. 375-384.
Romero, L.A. et al. (2000), Phase encoding of shot records in prestack migration, *Geophysics* 65, pp. 426-436.
Ronen S. et al. (2005), "Imaging Downgoing waves from Ocean Bottom Stations," *SEG Expanded Abstracts*, pp. 963-967.
Routh, P. et al. (2011), "Encoded Simultaneous Source Full-Wavefield Inversion for Spectrally-Shaped Marine Streamer Data," SEG San Antonio 2011 Ann. Meeting, pp. 2433-2438.
Ryden, N. et al. (2006), "Fast simulated annealing inversion of surface waves on pavement using phase-velocity spectra," *Geophysics* 71(4), pp. R49-R58.
Sambridge, M.S. et al. (1991), "An Alternative Strategy for Non-Linear Inversion of Seismic Waveforms," *Geophysical Prospecting* 39, pp. 723-736.
Schoenberg, M. et al. (1989), "A calculus for finely layered anisotropic media," *Geophysics* 54, pp. 581-589.
Schuster, G.T. et al. (2010), "Theory of Multisource Crosstalk Reduction by Phase-Encoded Statics," SEG Denver 2010 Ann. Meeting, pp. 3110-3114.
Sears, T.J. et al. (2008), "Elastic full waveform inversion of multicomponent OBC seismic data," *Geophysical Prospecting* 56, pp. 843-862.
Sheen, D-H. et al. (2006), "Time domain Gauss-Newton seismic waveform inversion in elastic media," Geophysics J. Int. 167, pp. 1373-1384.
Shen, P. et al. (2003), "Differential semblance velocity analysis by wave-equation migration," $73^{rd}$ Ann. Meeting of Society of Exploration Geophysicists, 4 pgs.
Sheng, J. et al. (2006), "Early arrival waveform tomography on near-surface refraction data," *Geophysics* 71, pp. U47-U57.
Sheriff, R.E.et al. (1982), "*Exploration Seismology*", pp. 134-135.
Shih, R-C. et al. (1996), "Iterative pre-stack depth migration with velocity analysis," *Terrestrial, Atmospheric & Oceanic Sciences* 7(2), pp. 149-158.
Shin, C. et al. (2001), "Waveform inversion using a logarithmic wavefield," *Geophysics* 49, pp. 592-606.

Simard, P.Y. et al. (1990), "Vector Field Restoration by the Method of Convex Projections," *Computer Vision, Graphics and Image Processing* 52, pp. 360-385.
Soubaras, R. et al. (2007), "Velocity model building by semblance maximization of modulated-shot gathers," *Geophysics* 72(5), pp. U67-U73.
Spitz, S. (2008), "Simultaneous source separation: a prediction-subtraction approach," 78th Annual Int'l. Meeting, *SEG Expanded Abstracts*, pp. 2811-2815.
Stefani, J. (2007), "Acquisition using simultaneous sources," 69th Annual Conf. and Exh., *EAGE Extended Abstracts*, 5 pgs.
Symes, W.W. (2007), "Reverse time migration with optimal checkpointing," *Geophysics* 72(5), pp. P.SM213-SM221.
Symes, W.W. (2009), "Interface error analysis for numerical wave propagation," *Compu. Geosci.* 13, pp. 363-371.
Tang, Y. (2008), "Wave-equation Hessian by phase encoding," *SEG Expanded Abstracts* 27, pp. 2201-2205.
Tang, Y. (2009), "Target-oriented wave-equation least-squares migration/inversion with phase-encoded Hessian," *Geophysics* 74, pp. WCA95-WCA107.
Tang, Y. et al. (2010), "Preconditioning full waveform inversion with phase-encoded Hessian," *SEG Expanded Abstracts* 29, pp. 1034-1037.
Gao, H. et al. (2008), "Implementation of perfectly matched layers in an arbitrary geometrical boundary for leastic wave modeling," *Geophysics J. Int.* 174, pp. 1029-1036.
Gibson, B. et al. (1984), "Predictive deconvolution and the zero-phase source," *Geophysics* 49(4), pp. 379-397.
Godfrey, R. J. et al. (1998), "Imaging the Foiaven Ghost," *SEG Expanded Abstracts*, 4 pgs.
Griewank, A. (1992), "Achieving logarithmic growth of temporal and spatial complexity in reverse automatic differentiation," 1 *Optimization Methods and Software*, pp. 35-54.
Griewank, A. (2000), Evaluating Derivatives: Principles and Techniques of Algorithmic Differentiation, Society for Industrial and Applied Mathematics, 49 pgs.
Griewank, A. et al. (2000), "Algorithm 799: An implementation of checkpointing for the reverse or adjoint mode of computational differentiation," 26 *ACM Transactions on Mathematical Software*, pp. 19-45.
Griewank, A. et al. (1996), "Algorithm 755: A package for the automatic differentiation of algorithms written in C/C++," *ACM Transactions on Mathematical Software* 22(2), pp. 131-167.
Haber, E. et al. (2010), "An effective method for parameter estimation with PDE constraints with multiple right hand sides," Preprint—UBC http://www.math.ubc.ca/~haber/pubs/PdeOptStochV5.pdf.
Hampson, D.P. et al. (2005), "Simultaneous inversion of pre-stack seismic data," SEG $75^{th}$ Annual Int'l. Meeting, *Expanded Abstracts*, pp. 1633-1637.
Heinkenschloss, M. (2008), :"Numerical Solution of Implicity Constrained Optimization Problems," CAAM Technical Report TR08-05, 25 pgs.
Helbig, K. (1994), "Foundations of Anisotropy for Exploration Seismics," Chapter 5, pp. 185-194.
Herrmann, F.J. (2010), "Randomized dimensionality reduction for full-waveform inversion," *EAGE abstract* G001, EAGE Barcelona meeting, 5 pgs.
Holschneider, J. et al. (2005), "Characterization of dispersive surface waves using continuous wavelet transforms," *Geophys. J. Int.* 163, pp. 463-478.
Hu, L.Z. et al. (1987), "Wave-field transformations of vertical seismic profiles," *Geophysics* 52, pp. 307-321.
Huang, Y. et al. (2012), "Multisource least-squares migration of marine streamer and land data with frequency-division encoding," *Geophysical Prospecting* 60, pp. 663-680.
Igel, H. et al. (1996), "Waveform inversion of marine reflection seismograms for P impedance and Poisson's ratio," *Geophys. J. Int.* 124, pp. 363-371.
Ikelle, L.T. (2007), "Coding and decoding: Seismic data modeling, acquisition, and processing," 77th Annual Int'l. Meeting, SEG Expanded Abstracts, pp. 66-70.

(56) References Cited

OTHER PUBLICATIONS

Jackson, D.R. et al. (1991), "Phase conjugation in underwater acoustics," *J. Acoust. Soc. Am.* 89(1), pp. 171-181.

Jing, X. et al. (2000), "Encoding multiple shot gathers in prestack migration," *SEG International Exposition and 70th Annual Meeting Expanded Abstracts*, pp. 786-789.

Kennett, B.L.N. (1991), "The removal of free surface interactions from three-component seismograms", *Geophys. J. Int.* 104, pp. 153-163.

Kennett, B.L.N. et al. (1988), "Subspace methods for large inverse problems with multiple parameter classes," *Geophysical J.* 94, pp. 237-247.

Krebs, J.R. (2008), "Fast Full-wavefield seismic inversion using encoded sources," *Geophysics* 74(6), pp. WCC177-WCC188.

Krohn, C.E. (1984), "Geophone ground coupling," *Geophysics* 49(6), pp. 722-731.

Kroode, F.T. et al. (2009), "Wave Equation Based Model Building and Imaging in Complex Settings," OTC 20215, 2009 Offshore Technology Conf., Houston, TX, May 4-7, 2009, 8 pgs.

Kulesh, M. et al. (2008), "Modeling of Wave Dispersion Using Continuous Wavelet Transforms II: Wavelet-based Frequency-velocity Analysis," *Pure Applied Geophysics* 165, pp. 255-270.

Lancaster, S. et al. (2000), "Fast-track 'colored' inversion," *70th SEG Ann. Meeting, Expanded Abstracts*, pp. 1572-1575.

Lazaratos, S. et al. (2009), "Inversion of Pre-migration Spectral Shaping," 2009 SEG Houston Int'l. Expo. & Ann. Meeting, *Expanded Abstracts*, pp. 2383-2387.

Lazaratos, S. (2006), "Spectral Shaping Inversion for Elastic and Rock Property Estimation," *Research Disclosure*, Issue 511, pp. 1453-1459.

Lazaratos, S. et al. (2011), "Improving the convergence rate of full wavefield inversion using spectral shaping," *SEG Expanded Abstracts* 30, pp. 2428-2432.

Lecomte, I. (2008), "Resolution and illumination analyses in PSDM: A ray-based approach," *The Leading Edge*, pp. 650-663.

Lee, S. et al. (2010), "Subsurface parameter estimation in full wavefield inversion and reverse time migration," SEG Denver 2010 Annual Meeting, pp. 1065-1069.

Levanon, N. (1988), "Radar Principles," Chpt. 1, John Whiley & Sons, New York, pp. 1-18.

Liao, Q. et al. (1995), "2.5D full-wavefield viscoacoustic inversion," *Geophysical Prospecting* 43, pp. 1043-1059.

Liu, F. et al. (2007), "Reverse-time migration using one-way wavefield imaging condition," *SEG Expanded Abstracts* 26, pp. 2170-2174.

Liu, F. et al. (2011), "An effective imaging condition for reverse-time migration using wavefield decomposition," *Geophysics* 76, pp. S29-S39.

Maharramov, M. et al. (2007) , "Localized image-difference wave-equation tomography," SEG Annual Meeting, *Expanded Abstracts*, pp. 3009-3013.

Malmedy, V. et al. (2009), "Approximating Hessians in unconstrained optimization arising from discretized problems," *Computational Optimization and Applications*, pp. 1-16.

Marcinkovich, C. et al. (2003), "On the implementation of perfectly matched layers in a three-dimensional fourth-order velocity-stress finite difference scheme," *J. of Geophysical Research* 108(B5), 2276.

Martin, G.S. et al. (2006), "Marmousi2: An elastic upgrade for Marmousi," *The Leading Edge*, pp. 156-166.

Meier, M.A. et al. (2009), "Converted wave resolution," *Geophysics*, 74(2):doi:10.1190/1.3074303, pp. Q1-Q16.

Moghaddam, P.P. et al. (2010), "Randomized full-waveform inversion: a dimenstionality-reduction approach," *80th SEG Ann. Meeting, Expanded Abstracts*, pp. 977-982.

Abt, D.L. et al. (2010), "North American lithospheric discontinuity structured imaged by Ps and Sp receiver functions", *J. Geophys. Res.*, 24 pgs.

Akerberg, P., et al. (2008), "Simultaneous source separation by sparse radon transform," 78th SEG Annual International Meeting, *Expanded Abstracts*, pp. 2801-2805.

Aki, K. et al. (1980), "Quantitative Seismology: Theory and Methods vol. I—Chapter 7—Surface Waves in a Vertically Heterogenous Medium," W.H. Freeman and Co., pp. 259-318.

Aki, K. et al. (1980), "Quantitative Seismology: Theory and Methods vol. I," W.H. Freeman and Co., p. 173.

Aki et al. (1980), "Quantitative Seismology, Theory and Methods," Chapter 5.20, W.H. Freeman & Co., pp. 133-155.

Amundsen, L. (2001), "Elimination of free-surface related multiples without need of the source wavelet," *Geophysics* 60(1), pp. 327-341.

Anderson, J.E. et al. (2008), "Sources Near the Free-Surface Boundary: Pitfalls for Elastic Finite-Difference Seismic Simulation and Multi-Grid Waveform Inversion," *70th EAGE Conf. & Exh.*, 4 pgs.

Barr, F.J. et al. (1989), "Attenuation of Water-Column Reverberations Using Pressure and Velocity Detectors in a Water-Bottom Cable," *59th Annual SEG meeting, Expanded Abstracts*, pp. 653-656.

Baumstein, A. et al. (2009), "Scaling of the Objective Function Gradient for Full Wavefield Inversion," SEG Houston 2009 Int'l. Expo and Annual Meeting, pp. 224-2247.

Beasley, C. (2008), "A new look at marine simultaneous sources," *The Leading Edge* 27(7), pp. 914-917.

Beasley, C. (2012), "A 3D simultaneous source field test processed using alternating projections: a new active separation method," *Geophsyical Prospecting* 60, pp. 591-601.

Beaty, K.S. et al. (2003), "Repeatability of multimode Rayleigh-wave dispersion studies," *Geophysics* 68(3), pp. 782-790.

Beaty, K.S. et al. (2002), "Simulated annealing inversion of multimode Rayleigh wave dispersion waves for geological structure," *Geophys. J. Int.* 151, pp. 622-631.

Becquey, M. et al. (2002), "Pseudo-Random Coded Simultaneous Vibroseismics," SEG Int'l. Exposition and 72th Annl. Mtg., 4 pgs.

Ben-Hadj-Ali, H. et al. (2009), "Three-dimensional frequency-domain full waveform inversion with phase encoding," *SEG Expanded Abstracts*, pp. 2288-2292.

Ben-Hadj-Ali, H. et al. (2011), "An efficient frequency-domain full waveform inversion method using simultaneous encoded sources," *Geophysics* 76(4), pp. R109-R124.

Benitez, D. et al. (2001), "The use of the Hilbert transform in ECG signal analysis," *Computers in Biology and Medicine* 31, pp. 399-406.

Berenger, J-P. (1994), "A Perfectly Matched Layer for the Absorption of Electromagnetic Waves," *J. of Computational Physics* 114, pp. 185-200.

Berkhout, A.J. (1987), "Applied Seismic Wave Theory," Elsevier Science Publishers, p. 142.

Berkhout, A.J. (2008), "Changing the mindset in seismic data acquisition," *The Leading Edge* 27(7), pp. 924-938.

Beylkin, G. (1985), "Imaging of discontinuities in the inverse scattring problem by inversion of a causal generalized Radon transform," *J. Math. Phys.* 26, pp. 99-108.

Biondi, B. (1992), "Velocity estimation by beam stack," *Geophysics* 57(8), pp. 1034-1047.

Bonomi, E. et al. (2006), "Wavefield Migration plus Monte Carlo Imaging of 3D Prestack Seismic Data," *Geophysical Prospecting* 54, pp. 505-514.

Boonyasiriwat, C. et al. (2010), 3D Multisource Full-Waveform using Dynamic Random Phase Encoding, SEG Denver 2010 Annual Meeting, pp. 1044-1049.

Boonyasiriwat, C. et al. (2010), 3D Multisource Full-Waveform using Dynamic Random Phase Encoding, SEG Denver 2010 Annual Meeting, pp. 3120-3124.

Bunks, C., et al. (1995), "Multiscale seismic waveform inversion," *Geophysics* 60, pp. 1457-1473.

Burstedde, G. et al. (2009), "Algorithmic strategies for full waveform inversion: 1D experiments," *Geophysics* 74(6), pp. WCC17-WCC46.

Chavent, G. et al. (1999), "An optimal true-amplitude least-squares prestack depth-migration operator," *Geophysics* 64(2), pp. 508-515.

(56) References Cited

OTHER PUBLICATIONS

Choi, Y. et al. (2011), "Application of encoded multisource waveform inversion to marine-streamer acquisition based on the global correlation," 73$^{rd}$ EAGE Conference, *Abstract*, pp. F026.

Choi, Y et al. (2012), "Application of multi-source waveform inversion to marine stream data using the global correlation norm," *Geophysical Prospecting* 60, pp. 748-758.

Clapp, R.G. (2009), "Reverse time migration with random boundaries," SEG International Exposition and Meeting, *Expanded Abstracts*, pp. 2809-2813.

Dai, W. et al. (2010), "3D Multi-source Least-squares Reverse Time Migration," SEG Denver 2010 Annual Meeting, pp. 3120-3124.

Delprat-Jannuad, F. et al. (2005), "A fundamental limitation for the reconstruction of impedance profiles from seismic data," *Geophysics* 70(1), pp. R1-R14.

Dickens, T.A. et al. (2011), RTM angle gathers using Poynting vectors, *SEG Expanded Abstracts* 30, pp. 3109-3113.

Donerici, B. et al. (1005), "Improved FDTD Subgridding Algorithms Via Digital Filtering and Domain Overriding," *IEEE Transactions on Antennas and Propagation* 53(9), pp. 2938-2951.

Downey, N. et al. (2011), "Random-Beam Full-Wavefield Inversion," 2011 San Antonio Annual Meeting, pp. 2423-2427.

Dunkin, J.W. et al. (1973), "Effect of Normal Moveout on a Seismic Pluse," *Geophysics* 38(4), pp. 635-642.

Dziewonski A. et al. (1981), "Preliminary Reference Earth Model", *Phys. Earth Planet. Int.* 25(4), pp. 297-356.

Ernst, F.E. et al. (2000), "Tomography of dispersive media," *J. Acoust. Soc. Am* 108(1), pp. 105-116.

Ernst, F.E. et al. (2002), "Removal of scattered guided waves from seismic data," *Geophysics* 67(4), pp. 1240-1248.

Esmersoy, C. (1990), "Inversion of P and SV waves from multicomponent offset vertical seismic profiles", *Geophysics* 55(1), pp. 39-50.

Etgen, J.T. et al. (2007), "Computational methods for large-scale 3D acoustic finite-difference modeling: A tutorial," *Geophysics* 72(5), pp. SM223-SM230.

Fichtner, A. et al. (2006), "The adjoint method in seismology I. Theory," *Physics of the Earth and Planetary Interiors* 157, pp. 86-104.

Forbriger, T. (2003), "Inversion of shallow-seismic wavefields: I. Wavefield transformation," *Geophys. J. Int.* 153, pp. 719-734.

U.S. Appl. No. 14/329,431, filed Jul. 11, 2014, Krohn et al.

U.S. Appl. No. 14/330,767, filed Jul. 14, 2014, Tang et al.

Ajo-Franklin, J.B. (2009), "Optimal experiment design for time-lapse traveltime tomography," *Geophysics* 74(4), pp. Q27-Q40.

Baptiste, D. et al. (2012), "Changing OBC Acqustion Geometry Using FWI Modelling," 74$^{th}$ EAGE Conference & Exh., Copenhagen, Denmark, 5 pgs.

Berkhout, A.J. (1992), "Areal shot record technology," *Journal of Seismic Exploration* 1, pp. 251-264.

Coles, D.A. et al. (2009), "A method of fast, sequential experimental design for linearized geophysical inverse problems," *Geophys. J. Int.* 178, pp. 145-158.

Curtis, A. (1999), "Optimal design of focused experiments and surveys," *Geophys. J. Int.* 139, pp. 205-215.

Curtis, A. (1999), "Optimal experiment design: cross-borehole tomographic examples," *Geophys. J. Int.* 136, pp. 637-650.

Curtis, A. (2004), "Theory of model-based geophysical survey and experimental design, Part 1—linear problems," *The Leading Edge*, pp. 997-1004.

Curtis, A. (2004), "Theory of model-based geophysical survey and experimental design, Part 2—nonlinear problems," *The Leading Edge*, pp. 1112-1117.

Fallat, M.R. et al. (1999), "Geoacoustic inversion via local, global, and hybrid algorithms," *Journal of the Acoustical Society of America* 105, pp. 3219-3230.

Haber, E. et al. (2008), "Numerical methods for experimental design of large-scale linear ill-posed inverse problems," *Inverse Problems* 24, pp. 1-21.

L'Heureux, E. et al. (2012), "Finite-difference modeling for acquisition design of an ocean-bottom seismic survey," 2912 SEG Las Vegas Annual Meeting, 5 pgs.

Maurer, H. et al. (1997), "Optimized design of geophysical experiments," *The Leading Edge*, 17, 6 pgs.

Maurer, H. et al. (2010), "Recent advances in optimized geophysical survey design," *Geophyics* 75(5), pp. 75A177-75A194.

Miller, C.R. et al. (2007), "Resolution analysis of geophysical images: Comparison between point spread function and region of data influence measures," *Geophysical Prospecting* 55, pp. 835-852.

Mora, P. (1987), "Nonlinear two-dimensional elastic inversion of multi-offset seismic data," *Geophysics* 52, pp. 1211-1228.

Oldenborger, G.A. et al. (2009), "The point-spread function measure of resolution for the 3-D electrical resistivity experiment," *Geophys. J. Int.* 176, pp. 405-414.

Oldenborger, G.A. et al. (2007), "Model reliability for 3D electrical resistivty tomography: Application of the volume of investigation index to a time-lapse monitoring experiment," *Geophysics* 72(4), pp. F167-F175.

Regone, C.J. (2007), "Using 3D finite-difference modeling to design wide-azimuth surveys for improved subsalt imaging," *Geophysics* 72(5), pp. SM231-SM239.

Routh, P.S. et al. (2005), "Optimal survey design using the point spread function measure of resolution," SEG 2005 Annual Meeting, pp. 1033-1037.

Sirgue, L. (2004), "Efficient waveform inversion and imaging: A strategy for selecting temporal frequencies," *Geophysics* 69, pp. 231-248.

Tarantola, A. (1984), "Inversion of seismic reflection data in the acoustic approximation," *Geophysics* 49, pp. 1259-1266.

van Manen, D.J. (2005), "Making wave by time reversal," SEG International Exposition and 75$^{th}$ Annual Meeting, *Expanded Abstracts*, pp. 1763-1766.

van Veldhuizen, E.J. et al. (2008), "Acquisition geometry analysis in complex 3D media," *Geophysics* 73(5), pp. Q43-Q58.

Zhang, Y. (2005), "Delayed-shot 3D depth migration," *Geophysics* 70, pp. E21-E28.

Tarantola, A. (1986), "A strategy for nonlinear elastic inversion of seismic reflection data," *Geophysics* 51(10), pp. 1893-1903.

Tarantola, A. (1988), "Theoretical background for the inversion of seismic waveforms, including elasticity and attenuation," *Pure and Applied Geophysics* 128, pp. 365-399.

Tarantola, A. (2005), "Inverse Problem Theory and Methods for Model Parameter Estimation," *SIAM*, pp. 79.

Trantham, E.C. (1994), "Controlled-phase acquisition and processing," *SEG Expanded Abstracts* 13, pp. 890-894.

Tsvankin, I. (2001), "Seismic Signatures and Analysis of Reflection Data in Anisotropic Media," Elsevier Science, p. 8.

Valenciano, A.A. (2008), "Imaging by Wave-Equation Inversion," A Dissertation, Stanford University, 138 pgs.

van Groenestijn, G.J.A. et al. (2009), "Estimating primaries by sparse inversion and application to near-offset reconstruction," *Geophyhsics* 74(3), pp. A23-A28.

Verschuur, D.J. (2009), Target-oriented, least-squares imaging of blended data, 79th Annual Int'l. Meeting, *SEG Expanded Abstracts*, pp. 2889-2893.

Verschuur, D.J. et al. (1992), "Adaptive surface-related multiple elimination," *Geophysics* 57(9), pp. 1166-1177.

Verschuur, D.J. (1989), "Wavelet Estimation by Prestack Multiple Elimination," *SEG Expanded Abstracts* 8, pp. 1129-1132.

Versteeg, R. (1994), "The Marmousi experience: Velocity model determination on a synthetic complex data set," *The Leading Edge*, pp. 927-936.

Vigh, D. et al. (2008), "3D prestack plane-wave, full-waveform inversion," *Geophysics* 73(5), pp. VE135-VE144.

Wang, Y. (2007), "Multiple prediction through inversion: Theoretical advancements and real data application," Geophysics 72(2), pp. V33-V39.

Wang, K. et al. (2009), "Simultaneous full-waveform inversion for source wavelet and earth model," SEG Int'l. Expo. & Ann. Meeting, Expanded Abstracts, pp. 2537-2541.

(56) References Cited

OTHER PUBLICATIONS

Weglein, A.B. (2003), "Inverse scattering series and seismic exploration," *Inverse Problems* 19, pp. R27-R83.

Wong, M. et al. (2010), "Joint least-squares inversion of up- and down-going signal for ocean bottom data sets," *SEG Expanded Abstracts* 29, pp. 2752-2756.

Wu R-S. et al. (2006), "Directional illumination analysis using beamlet decomposition and propagation," *Geophysics* 71(4), pp. S147-S159.

Xia, J. et al. (2004), "Utilization of high-frequency Rayleigh waves in near-surface geophysics," *The Leading Edge,* pp. 753-759.

Xie, X. et al. (2002), "Extracting angle domain information from migrated wavefield," *SEG Expanded Abstracts*21, pp. 1360-1363.

Xie, X.-B. et al. (2006), "Wave-equation-based seismic illumination analysis," *Geophysics* 71(5), pp. S169-S177.

Yang, K. et al. (2000), "Quasi-Orthogonal Sequences for Code-Division Multiple-Access Systems," *IEEE Transactions on Information Theory* 46(3), pp. 982-993.

Yoon, K. et al. (2004), "Challenges in reverse-time migration," *SEG Expanded Abstracts* 23, pp. 1057-1060.

Young, J. et al. (2011), "An application of random projection to parameter estimation in partial differential equations," SIAM, 20 pgs.

Ziolkowski, A. (1991), "Why don't we measure seismic signatures?," *Geophysics* 56(2), pp. 190-201.

\* cited by examiner

SEISMIC SURVEY DESIGN USING FULL WAVEFIELD INVERSION

CROSS-REFERENCE TO RELATED APPLICATION

This application claims the benefit of U.S. Provisional Patent Application 62/059,541, filed Oct. 3, 2014, entitled SEISMIC SURVEY DESIGN USING FULL WAVEFIELD INVERSION, the entirety of which is incorporated by reference herein.

FIELD OF THE INVENTION

This disclosure relates generally to the field of geophysical prospecting and, more particularly, to seismic survey prospecting for hydrocarbons. Specifically, the disclosure relates to a method for using full wavefield inversion of seismic data to design a cost-effective seismic survey.

BACKGROUND OF THE INVENTION

Geophysical Acquisition Design

Three-dimensional (3D) seismic surveys in the exploration industry can cost tens to hundreds of million dollars. 3D survey data are expensive to acquire because of the necessary short receiver and source intervals, which are primarily driven by signal and noise issues, and the wide range of offsets and azimuths that are required by imaging methods. Ultimately the quality of the processed data and subsequent interpretations are dependent on how well the survey was designed and acquired. No matter how sophisticated the methods used to process the data are, the processing cannot compensate for a poorly planned 3D survey and inadequate sampling, which can end up making the survey a waste of time and resources if it does not meet its objectives.

Acquisition design typically starts by assuming different designs and then testing and evaluating each design. The first step is a survey geometry analysis based strictly on surface bins. For each survey geometry, bin-based attributes, such as the fold and the offset and azimuth distributions, are computed assuming uniform earth properties. The attributes are used to select a few survey geometries for further consideration. Then if the geometry is complex, a geological model may be constructed and used for further evaluation of a few designs selected based on the geometry analysis. Source and receiver locations are assumed and seismic waves are then propagated from each of the sources to the target and then to each of the receivers using some form of computer simulation. The computer simulation may be done with ray-tracing methods or by solving the one-way or two-way wave-equation. Wave-equation methods are more accurate for complex media but are much more computer intensive. Methods differ in how they use and evaluate the computer simulations for each survey design.

"Brute-Force" Comparison Methods

Comparison of two survey designs using a 3D geological model can be performed by fully simulating, and then, separately processing and imaging the computer simulated data corresponding to the two designs. This may be called a "brute-force" method. The two imaged volumes are compared to determine whether or not they meet the survey objectives. This typically requires wave-equation simulation with finite-difference methods to generate data that most accurately approximate the data that would be recorded in the field. Then each dataset must be separately processed and imaged as would be the field data, typically with finite-difference migration methods such as Reverse Time Migration (RTM). The wave equation simulation and processing are both time consuming and expensive; it can be prohibitively expense to carry out this effort for several models and for many different acquisition geometries. Most commonly this step is done after other analysis to compare only two scenarios.

There are a number of limitations to the brute-force methods (full simulation and comparison) in addition to the cost and time required. Developing a metric for quantifying the difference between the two imaged volumes from different design scenarios is difficult and often comes down to a "beauty contest." An interpreter may look at the images and pick one as being more "geological". Seismic attributes such as an amplitude map at a subsurface layer, may be computed and compared. The choice of the best geometry is subjective because often one area looks better with one design and another area looks better for the other design. A second problem is that the geological model is uncertain, and there is no way to validate the sensitivity to changes in the model. It is prohibitively expensive to compare two full 3D surveys for two or more models. Typically, models are built from existing information such as processed spec data and known geological information in the area. Often there are several models in an area, particularly in exploration settings, suggesting many possible geological scenarios and plays. A third problem with this approach is that this and other approaches do not interrogate the crucial and fundamental need to obtain an accurate velocity model for the imaging. Typically, a single smoothed version of the known model velocities is used for imaging both of the two designs. This ignores the fact that the imaging, and in particular the imaged amplitudes, critically depend on the velocities used for imaging, and these velocities are unknown and must be determined from the data. The method does not evaluate whether or not one survey design is better than another survey design for velocity determination. Conventional velocity determination is a tedious process that requires subjective input and parameterization, and thus, it is difficult to compare the results of two designs because there can be differences from having two different people doing the determination or from one person doing it twice having learned from the first set.

The brute-force method (full simulation and comparison) involves shooting two geometries with the computer instead of in the field, processing the two geometries as would be done with field data, and then comparing the outputs. One example is illustrated in the publications of Carl Regone (28) comparing narrow and wide azimuth survey geometries for subsalt imaging. Another is the publication of L'Heureux (29) comparing receivers in a marine streamer to those on the ocean bottom. A third example is disclosed by Rekdal (34) who evaluates the effect of holes in the data coverage of a marine survey by observing the data quality degradation for processed and imaged data of a simulated survey with holes compared to the full-coverage survey, in which "data quality degradation" is related to the observation of artifacts in the images. Rekdal assumes a velocity model for imaging and does not solve for a velocity model or use a quantitative measure related to the model for evaluation.

A fourth example does test the two geometries for velocity determination, but only in 2D because of the cost and time required. Baptiste et al., [12] use 2D full waveform inversion to investigate survey parameters for an ocean bottom cable acquisition problem with increasing source-to-receiver offsets. Although their approach uses full waveform inversion in survey design, they are performing it in the same manner as one would do if processing the field data, and each geometry is processed and inverted separately. They restrict the test to 2D because of speed issues.

Attribute Methods

Because of the cost and time associated with simulating and processing 3D data, it is more common to compute and display attributes related to illumination qualities of the acquisition geometry instead of fully processing and imaging the simulated data. This may be called the "attribute method." The attributes may be computed for a reflective interface in the model or computed for a single target location. Typical attributes may include illumination hits per grid cell, simulated migration amplitude maps, and angle coverage displays. The simulation method may be a simple ray-tracing method or a more sophisticated wave-equation method. In the latter case, it is more common to compute only attributes for one target location because of the increase in cost. The problem with all the attribute methods is that it is not clear how the attributes are linked to the survey objectives and the ability to image a specific area of the subsurface. It can be difficult to evaluate cost/benefit tradeoffs between different geometries for the purposes of reservoir delineation and characterization. It is typical to display an image of the attributes and pick the "better" pattern without any direct relationship between the pattern and the objectives. In addition, attributes related to the imaged amplitude or energy are used, but for seismic waves, amplitudes are secondary to kinematics based on the traveltimes of the seismic waves. Imaging requires good imaging velocities determined from the traveltimes. None of these methods investigate the ability to determine the velocities for the imaging in the first place. Some examples of the attribute approach are briefly described in the following sections.

A commercial package for performing ray tracing and attribute analysis is provided by Norsar (www.norsar.com). The package traces rays for the geometrical model and then computes illumination attributes and imaged amplitudes.

Campbell [30] teaches a method to design a targeted survey based on an illumination analysis in which emergent ray paths are observed, and a determination is made to put sources and receivers where the rays are concentrated.

Bernitas [31] teaches a hybrid wave-equation ray-tracing method for survey design that computes and analyzes wave function amplitudes and illumination images.

Velduizen[32] uses a focal beam approach to predict the imaged amplitudes at the target. For a single target location, she determines the range of illumination angles and azimuths for which the amplitude is uniform.

Cao [33] teaches a use of the two-way wave equation and computing and analyzing the energy and associated energy attributes for use in survey design.

Optimization Methods

Instead of comparing attribute displays, a number of papers propose to invert for the best geometry that minimizes an objective function based on an attribute. This may be called the "optimization method." Mauerer et al. [1] provide a comprehensive review of several survey design methods that are posed as inverse problems. The goal is to determine optimal survey parameters such as source and receiver locations for geophysical acquisition to address specific objectives of "better" illuminating subsurface models. References that pose the survey design as an optimization problem include the following.

Mauerer and Boerner [2] pose the survey design as a statistical inverse problem and use nonlinear optimization method to solve for survey parameters.

Curtis et al., [4, 5, 6, 7], solve a borehole acquisition design problem as a Bayesian survey design problem as well as maximizing the eigenvalues of inverse operators. Both approaches are dependent on posing it as inverse problem. Haber et al. [9], Coles and Morgan [3] also apply a Bayesian approach to solve survey design problems.

Routh et al. [10] and Oldenborger and Routh [11] maximize the resolution measure of a point spread function to obtain optimal survey parameters by solving a highly nonlinear optimization problem for an electromagnetic and electrical problem. Ajo-Franklin [8] extended the Routh at al. [10] approach to consider many point spread functions to solve for survey design parameters for a borehole problem. All of the approaches are formulated as a nonlinear inverse problem.

All of these optimization methods pose the survey design as an optimization problem, and it is well recognized that such approaches are extremely nonlinear and difficult to solve. Moreover, such optimization methods can rarely be applied to large scale experiments such as full scale 3D seismic surveys. In the concluding remarks of their review paper, Mauerer et al. [1] state that most survey design algorithms are computationally expensive, which imposes severe constraints on applications to realistic design problems. As a future initiative, they suggest improving the computational efficiency of key modules such as forward simulation engines that are called many times while solving a design algorithm. Even with such advances, the method is unlikely to be fast or robust enough to be used for realistic large scale 3D survey design problems commonly encountered in seismic industry. In the approach described in the present disclosure, the whole premise of posing the survey design as an optimization problem is avoided. That not only avoids solving a complicated nonlinear optimization problem but also allows one to consider realistic large scale survey design problems commonly encountered in seismic industry using a simultaneous source method.

Full Wavefield Inversion with Simultaneous Sources

Full-wavefield inversion of surface seismic data is an emerging technology for processing seismic surveys; however, even with modern computing power, seismic full wavefield inversion is still a computationally expensive endeavor. However, the benefit of obtaining a detailed representation of the subsurface using this method provides strong incentive to overcome this impediment. Development of algorithms and workflows that lead to faster turn around time is a key step towards making this technology feasible for field scale data. Seismic full waveform inversion involves several iterations of forward and adjoint simulation of the data. Therefore techniques that reduce the cost of forward and adjoint computation runs will allow users to solve larger-scale problems in a reasonable amount of time.

Geophysical inversion [13, 14] attempts to find a model of subsurface properties that optimally explains observed data and satisfies geological and geophysical constraints. There are a large number of well-known methods of geophysical inversion. These well-known methods fall into one of two categories, iterative inversion and non-iterative inversion. The following are definitions of what is commonly meant by each of the two categories:

Non-iterative inversion—inversion that is accomplished by assuming some simple background model and updating the model based on the input data. This method does not use the updated model as input to another step of inversion. For the case of seismic data these methods are commonly referred to as imaging, migration, diffraction tomography or Born inversion.

Iterative inversion—inversion involving repetitious improvement of the subsurface properties model such that a model is found that satisfactorily explains the observed data. If the inversion converges, then the final model will better explain the observed data and will more closely approximate the actual subsurface properties. Iterative inversion usually produces a more accurate model than non-iterative inversion, but is much more expensive to compute.

Iterative inversion is generally preferred over non-iterative inversion, because it yields more accurate subsurface parameter models. Unfortunately, iterative inversion is so computationally expensive that it is impractical to apply it to many problems of interest. This high computational expense is the result of the fact that all inversion techniques require many computationally intensive simulations. The compute time of any individual simulation is proportional to the number of sources to be inverted, and typically there are large numbers of sources in geophysical data, where the term source as used in the preceding refers to an activation location of a source apparatus. The problem is exacerbated for iterative inversion, because the number of simulations that must be computed is proportional to the number of iterations in the inversion, and the number of iterations required is typically on the order of hundreds to thousands.

The most commonly employed iterative inversion method employed in geophysics is cost function optimization. Cost function optimization involves iterative minimization or maximization of the value, with respect to the model M, of a cost function S(M) which is a measure of the misfit between the calculated and observed data (this is also sometimes referred to as the objective function), where the calculated data are simulated with a computer using the current geophysical properties model and the physics governing propagation of the source signal in a medium represented by a given geophysical properties model. The simulation computations may be done by any of several numerical methods including but not limited to finite difference, finite element or ray tracing. The simulation computations can be performed in either the frequency or time domain.

Cost function optimization methods are either local or global [15]. Global methods simply involve computing the cost function S(M) for a population of models $\{M_1, M_2, M_3, \ldots\}$ and selecting a set of one or more models from that population that approximately minimize S(M). If further improvement is desired this new selected set of models can then be used as a basis to generate a new population of models that can be again tested relative to the cost function S(M). For global methods each model in the test population can be considered to be an iteration, or at a higher level each set of populations tested can be considered an iteration. Well known global inversion methods include Monte Carlo, simulated annealing, genetic and evolution algorithms.

Unfortunately global optimization methods typically converge extremely slowly and therefore most geophysical inversions are based on local cost function optimization. Algorithm 1 summarizes local cost function optimization.
 1. selecting a starting model,
 2. computing the gradient of the cost function S(M) with respect to the parameters that describe the model,
 3. searching for an updated model that is a perturbation of the starting model in the negative gradient direction that better explains the observed data.

Algorithm 1—Algorithm for Performing Local Cost Function Optimization.

This procedure is iterated by using the new updated model as the starting model for another gradient search. The process continues until an updated model is found that satisfactorily explains the observed data. Commonly used local cost function inversion methods include gradient search, conjugate gradients and Newton's method.

Local cost function optimization of seismic data in the acoustic approximation is a common geophysical inversion task, and is generally illustrative of other types of geophysical inversion. When inverting seismic data in the acoustic approximation the cost function can be written as:

$$S(M) = \sum_{g=1}^{N_g} \sum_{r=1}^{N_r} \sum_{t=1}^{N_t} W(\psi_{calc}(M, r, t, w_g) - \psi_{obs}(r, t, w_g)) \quad \text{(Eqn. 1)}$$

where:
S=cost function,
M=vector of N parameters, $(m_1, m_2, \ldots m_N)$ describing the subsurface model,
g=gather index,
$w_g$=source function for gather g which is a function of spatial coordinates and time, for a point source this is a delta function of the spatial coordinates,
$N_g$=number of gathers,
r=receiver index within gather,
$N_r$=number of receivers in a gather,
t=time sample index within a trace,
$N_t$=number of time samples,
W=minimization criteria function (a common choice is $W(x)=x^2$, which is the least squares (L2) criteria),
$\psi_{calc}$=calculated seismic pressure data from the model M, often expressed as a matrix,
$\psi_{obs}$=measured seismic pressure data.

The gathers can be any type of gather that can be simulated in one run of a seismic forward modeling program. Usually the gathers correspond to a seismic shot, although the shots can be more general than point sources. For point sources the gather index g corresponds to the location of individual point sources. For plane wave sources g would correspond to different plane wave propagation directions. This generalized source data, $\psi_{obs}$, can either be acquired in the field or can be synthesized from data acquired using point sources. The calculated data $\psi_{calc}$ on the other hand can usually be computed directly by using a generalized source function when forward modeling. For many types of forward modeling, including finite difference modeling, the computation time needed for a generalized source is roughly equal to the computation time needed for a point source.

Equation (1) can be simplified to:

$$S(M) = \sum_{g=1}^{N_g} W(\delta(M, w_g)). \quad \text{(Eqn. 2)}$$

where the sum over receivers and time samples is now implied and, $$\delta(M, w_g) = \psi_{calc}(M, w_g) - \psi_{obs}(w_g) \quad \text{(Eqn. 3)}$$

Inversion attempts to update the model M such that S(M) is a minimum. This can be accomplished by local cost function optimization which updates the given model $M^{(k)}$ as follows:

$$M^{(k+1)} = M^{(k)} - \alpha^{(k)} \nabla_M S(M) \quad \text{(Eqn. 4)}$$

where k is the iteration number, a is the scalar size of the model update, and $\nabla_M S(M)$ is the gradient of the misfit function, taken with respect to the model parameters. The model perturbations, or the values by which the model is updated, are calculated by multiplication of the gradient of the objective function with a step length a, which must be repeatedly calculated.

From equation (2), the following equation can be derived for the gradient of the cost function:

$$\nabla_M S(M) = \sum_{g=1}^{N_g} \nabla_M W(\delta(M, w_g)). \quad \text{(Eqn. 5)}$$

So, to compute the gradient of the cost function, one must separately compute the gradient of each gather's contribution to the cost function, then sum those contributions. Therefore, the computational effort required for computing $\nabla_M S(M)$ is Ng times the compute effort required to determine the contribution of a single gather to the gradient. For geophysical problems, $N_g$ usually corresponds to the number of geophysical sources and is on the order of 10,000 to 100,000, greatly magnifying the cost of computing $\nabla_M S(M)$.

Note that computation of $\nabla_M W(\delta)$ requires computation of the derivative of $W(\delta)$ with respect to each of the N model parameters $m_i$. Since for geophysical problems $\underline{N}$ is usually very large (usually more than one million), this computation can be extremely time consuming if it had to be performed for each individual model parameter. Fortunately, the adjoint method can be used to efficiently perform this computation for all model parameters at once [13]. The adjoint method for the least squares objective function and a gridded model parameterization is summarized by the following algorithm:

1. Compute forward simulation of the data using the current model and the gather signature $w_g$ as the source to get $\psi_{calc}(M^{(k)}, w_g)$,
2. Subtract the observed data from the simulated data giving $\delta(M^{(k)}, w_g)$,
3. Compute the reverse simulation (i.e. backwards in time) using $\delta(M^{(k)}, w_g)$ as the source producing $\psi_{adjoint}(M^{(k)}, w_g)$,
4. Compute the integral over time of the product of $\psi_{calc}(M^{(k)}, w_g)$ and $\psi_{adjoint}(M^{(k)}, w_g)$ to get $\nabla_M W(\delta(M, w_g))$—where $\psi_{adjoint}$ is the adjoint matrix for matrix $\psi_{calc}$.

Algorithm 2—Algorithm for Computing the Least-Squares Cost-Function Gradient of a Gridded Model Using the Adjoint Method.

While computation of the gradients using the adjoint method is efficient relative to other methods, it is still very costly. In particular, the adjoint method requires two simulations, one forward in time and one backward in time, and for geophysical problems these simulations are usually very compute intensive. Also, as discussed above, this adjoint method computation must be performed for each measured data gather individually, increasing the compute cost by a factor of $N_g$.

The compute cost of all categories of inversion can be reduced by inverting data from combinations of the sources, rather than inverting the sources individually. This may be called simultaneous source inversion. Several types of source combination are known including: coherently sum closely spaced sources to produce an effective source that produces a wavefront of some desired shape (e.g. a plane wave), sum widely spaces sources, or fully or partially stacking the data before inversion.

The compute cost reduction gained by inverting combined sources is at least partly offset by the fact that inversion of the combined data usually produces a less accurate inverted model. This loss in accuracy is due to the fact that information is lost when the individual sources are summed, and therefore the summed data does not constrain the inverted model as strongly as the unsummed data. This loss of information during summation can be minimized by encoding each shot record before summing. Encoding before combination preserves significantly more information in the simultaneous source data, and therefore better constrains the inversion [16, 17]. Encoding also allows combination of closely spaced sources, thus allowing more sources to be combined for a given computational region. Various encoding schemes can be used with this technique including time shift encoding and random phase encoding. The remainder of this Background section briefly reviews various published geophysical simultaneous source techniques, both encoded and non-encoded.

Van Manen [19] suggests using the seismic interferometry method to speed up forward simulation. Seismic interferometry works by placing (in the simulation) sources everywhere on the boundary of the region of interest. These sources are modeled individually, and the wavefield at all locations for which a Green's function is desired is recorded. The Green's function between any two recorded locations can then be computed by cross-correlating the traces acquired at the two recorded locations and summing over all the boundary sources. If the data to be inverted have a large number of sources and receivers that are within the region of interest (as opposed to having one or the other on the boundary), then this is a very efficient method for computing the desired Green's functions. However, for the seismic data case, it is rare that both the source and receiver for the data to be inverted are within the region of interest. Therefore, this improvement has very limited applicability to the seismic inversion problem.

Berkhout [20] and Zhang [21] suggest that inversion in general can be improved by inverting non-encoded simultaneous sources that are summed coherently to produce some desired wave front within some region of the subsurface. (The main purpose of encoding is to make the source summation incoherent [17].) For example, point source data could be summed with time shifts that are a linear function of the source location to produce a down-going plane wave at some particular angle with respect to the surface. This technique could be applied to all categories of inversion. A problem with this method is that coherent summation of the source gathers necessarily reduces the amount of information in the data. So for example, summation to produce a plane wave removes all the information in the seismic data related to travel time versus source-receiver offset. This information is critical for updating the slowly varying background velocity model, and therefore Berkhout's method is not well constrained. To overcome this problem, many different coherent sums of the data (e.g. many plane waves with different propagation directions) could be inverted, but then efficiency is lost since the cost of inversion is proportional to the number of different sums inverted. Herein, such coherently summed sources are called generalized sources. Therefore, a generalized source can either be a point source or a sum of point sources that produces a wave front of some desired shape.

Van Riel [22] suggests inversion by non-encoded stacking or partial stacking (with respect to source-receiver offset) of the input seismic data, then defining a cost function with respect to this stacked data which will be optimized. Thus, this publication suggests improving cost function based inversion using non-encoded simultaneous sources. As was true of the Berkhout's [6] simultaneous source inversion method, the stacking suggested by this method reduces the amount of information in the data to be inverted and therefore the inversion is less well constrained than it would have been with the original data.

Mora [23] proposes inverting data that is the sum of widely spaced sources. Thus, this publication suggests improving the efficiency of inversion using non-encoded simultaneous source simulation. Summing widely spaced sources has the advantage of preserving much more information than the coherent sum proposed by Berkhout. However, summation of widely spaced sources implies that the aperture (model region inverted) that must be used in the inversion must be increased to accommodate all the widely spaced sources. Since the compute time is proportional to the area of this aperture, Mora's method does not produce as much efficiency gain as could be achieved if the summed sources were near each other.

Ober [24] suggests speeding up seismic migration, a special case of non-iterative inversion, by using simultaneous encoded sources. After testing various coding methods, Ober found that the resulting migrated images had significantly reduced signal-to-noise ratio due to the fact that broad band encoding functions are necessarily only approximately orthogonal. Thus, when summing more than 16 shots, the quality of the inversion was unsatisfactory. Since non-iterative inversion is not very costly to begin with, and since high signal-to-noise ratio inversion is desired, this technique is not widely practiced in the geophysical industry.

Ikelle [25] suggests a method for fast forward simulation by simultaneously simulating point sources that are activated (in the simulation) at varying time intervals. A method is also discussed for decoding these time-shifted simultaneous-source simulated data back into the separate simulations that would have been obtained from the individual point sources. These decoded data could then be used as part of any conventional inversion procedure. A problem with Ikelle's method is that the proposed decoding method will produce separated data having noise levels proportional to the difference between data from adjacent sources. This noise will become significant for subsurface models that are not laterally constant, for example from models containing dipping reflectors. Furthermore, this noise will grow in proportion to the number of simultaneous sources. Due to these difficulties, Ikelle's simultaneous source approach may result in unacceptable levels of noise if used in inverting a subsurface that is not laterally constant.

Source encoding proposed by Krebs et al. [17], which is incorporated herein by reference in all jurisdictions that allow it, is a very cost effective method to invert full wave field data. (The same approach of simultaneous inversion of an encoded gather will work for receivers, either via source-receiver reciprocity or by encoding the actual receiver locations in common-source gathers of data.) For fixed receivers, the forward and adjoint computations need to be performed only for a single effective source. Given the fact that hundreds of shots are recorded for typical 2D acquisition geometries, and thousands in the case of 3D surveys, computational savings from this method are quite significant. In practice, a fixed-receiver assumption is not strictly valid for most common field data acquisition geometries. In the case of marine streamer data, both sources and receivers move for every new shot. Even in surveys where the locations of receivers are fixed, the practice often is that not all receivers are "listening" to every shot, and the receivers that are listening can vary from shot-to-shot. This also violates the "fixed-receiver assumption." In addition, due to logistical problems, it is difficult to record data close to the source, and this means that near-offset data are typically missing. This is true for both marine and land surveys. Both of these factors mean that for a simultaneous source gather, every receiver location will be missing data for some source shots. In summary, in simultaneous encoded-source inversion, for a given simultaneous encoded gather, data are required at all receiver locations for every shot, and this may be referred to as the fixed-receiver assumption of simultaneous encoded-source inversion.

Routh et al. [18] propose an adjustment to straightforward application of simultaneous encoded sources (and/or receivers) inversion that would enhance its performance when the fixed-receiver assumption is compromised. Routh et al. [18] use a cross-correlation objective function to achieve the application of simultaneous encoded-sources for non-fixed data. Therefore many survey acquisition designs that are based on non-fixed spread such as narrow azimuth, wide azimuth, rich azimuth, coil geometry, ocean bottom cables, ocean bottom nodes and vertical seismic profiling can be investigated using the method described by Routh et al. [18]. Other published methods for mitigating the effects of non-listening receivers in simultaneous encoded source inversion include U.S. Pat. Nos. 8,437,998, 8,775,143 and U.S. Patent Publication No. 2013/0238246.

SUMMARY OF THE INVENTION

The present disclosure describes a method for model-based acquisition design that quantitatively compares different survey geometries and their ability to "resolve" the target objective, particularly its velocity. The method may begin with a base survey design deemed to represent minimum acceptable coverage, and explicitly queries the value in acquiring additional data traces, i.e. groups of source-receiver pairs, based on their usefulness to update the velocities or to image the target. The method utilizes simultaneous-source full wavefield inversion (FWI) tools that are optimized for scenario comparison and speed instead of accuracy of a single output. Additional speed increase may be obtained by using the results for a smaller survey as an initial model for a larger survey in a cascaded workflow. The method can be automated and should be fast enough to be used instead of ray-trace illumination studies to evaluate multiple models and multiple acquisition scenarios. The method is expected to be capable of being used as the primary design tool regardless of whether or not the desired seismic products include FWI inversions. The method is applicable to surface reflection geometries such as narrow azimuth, wide azimuth, ocean bottom nodes, ocean bottom cables, coil geometry, time-lapse (4D) survey design, etc. and to borehole geometries such as offset VSP, checkshots, cross-well, etc.

FIG. 2 is a flow chart showing a preferred embodiment of the present inventive method. The process begins with the selection of a "true" reference model to use in step 300 to generate (i.e., computer simulate) synthetic data for source and receiver locations corresponding to two or more survey design scenarios selected to be considered and compared. The design scenarios differ in their areal coverage, meaning more shot-to-receiver offsets and azimuth sampling, or recording data with finer intervals, or measuring more data components, or any combination of these. The selected acquisition geometry candidates are each characterized by groups of traces that are part of the total number of traces considered, hence the term subset may be used. They preferably are selected and processed by considering increasing areal coverage and cost. Then traces corresponding to the selected geometry scenario are extracted in steps 301 and 302 from the total number of simulated traces. These extracted subsets are used in separate FWI inversion steps 303 and 304. The initial model for each inversion step 303 and 304 may be a smoothed version of the reference model used in step 300 to generate the synthetic data. Often in practice there will be an existing depth migration model. The reference model for step 300 can be generated by adding details to the depth migration model such as layers, bodies, faults, and channels. The depth migration model itself, without these added details, can be used as the initial model to start the iterative simulations in 303-304. The inverted-model outputs are then quantitatively compared to the reference model in step 306 and used to select a cost-effective survey geometry for acquisition. (FIG. 2 illustrates only two acquisition geometry subsets, but the extension to more is straightforward.)

The objective of the process illustrated in FIG. 2 is to compare the inverted velocity model from each survey geometry subset to the reference velocity model, i.e. the velocity model used to simulate traces in step 300, and thereby decide whether each increment of additional survey coverage (i.e., expanding coverage from subset 1 to subset 2, or further expanding survey coverage to a subset 3, etc.) is worth the value added in model resolution. Using FWI to invert the data can provide the critical knowledge—what part of the velocity model is resolved by a particular acquisition geometry? Ability to resolve the velocity model should be one of the key components of the optimal acquisition design. This is often ignored in the conventional imaging procedure where a known velocity model is used to image the data. A key novel part of this invention is the last analytical step (306) shown in FIG. 2 along with the choice in steps 301 and 302 of different geometry subsets. The value of the additional data traces or wider areal coverage in the fuller dataset relative to the subset representing the base survey is a quantitative determination made using one or more statistics based on the accuracy of the model update, such as improved match to the first model and the rate of change in improvement with iterations. It may be noted that while each of the inversions 303-304 is an optimization problem, determining which corresponding survey geometry to select is not done by optimization.

In one embodiment, the invention is a method for evaluating seismic survey acquisition geometries, said acquisition geometries specifying source and receiver locations, said method comprising:

proposing two or more different acquisition geometries to evaluate;

assuming a subsurface reference model of velocity or other physical property, simulating, using a computer, synthetic measured seismic data corresponding to all source and receiver locations in the two or more acquisition geometries;

for each selected acquisition geometry, selecting from the synthetic measured seismic data those data corresponding to the source and receiver locations present in the selected acquisition geometry, and inverting the selected synthetic measured data by iterative, numerical inversion, using the computer, to obtain a final updated subsurface model; and comparing the final updated model for each proposed acquisition geometry to the reference model using a selected quantitative measure of agreement with the reference model, then selecting an acquisition geometry by balancing a high quantitative measure of agreement with a low survey cost.

BRIEF DESCRIPTION OF THE DRAWINGS

The advantages of the present invention are better understood by referring to the following detailed description and the attached drawings, in which.

The invention will be described in connection with example embodiments. However, to the extent that the following detailed description is specific to a particular embodiment or a particular use of the invention, this is intended to be illustrative only, and is not to be construed as limiting the scope of the invention. On the contrary, it is intended to cover all alternatives, modifications and equivalents that may be included within the scope of the invention, as defined by the appended claims.

DETAILED DESCRIPTION OF EXAMPLE EMBODIMENTS

Survey Design Scenario

The term survey design scenario, or any equivalent terms such as acquisition geometry, may refer to specific patterns for source and receiver locations (source and receiver grids) and possibly to the number of receivers (the receiver patch) active for each source excitation. Such acquisition geometries, as selected in steps 301 and 302, can be characterized by standard bin-based attributes, such as the aperture (extent of the area covered by sources and receivers), source sampling, receiver sampling, fold, offset distribution, and azimuth distribution, etc. The two or more survey design scenarios considered may have different source and receiver grids but may also (or instead) differ in the type of survey and equipment used, for example, an ocean bottom cable survey and a towed streamer survey, or use of single-component receivers or multicomponent receivers.

A plurality of different acquisition geometries to evaluate are selected, distinguished by the degree to which they sample the seismic wavefield. More sources and more receivers covering a larger area or deployed more densely or recording more components of motion result in more ways to illuminate the subsurface target, but also cost more money and time to acquire. The purpose of the present invention is to evaluate the benefit of such increases in areal coverage and illumination and the associated cost considering the complexity of the geology. In step 300, to be most efficient, we may simulate the synthetic data at every receiver location and for every source location present in the combination of all acquisition scenarios or areal coverage subsets. These results may be stored to provide the measured data for the "compute cost function" step in the inversion process for each individual geometry subset 301, 302, etc. In other words, at least one scenario necessarily is missing some traces out of the total number of traces simulated in step 300. Only the selected traces for each geometry subset and not the "missing traces" are used to compute the cost functions in the inversions 301 and 302, etc.

EXAMPLES: ACQUISITION DESIGN SCENARIOS

Figure 3:
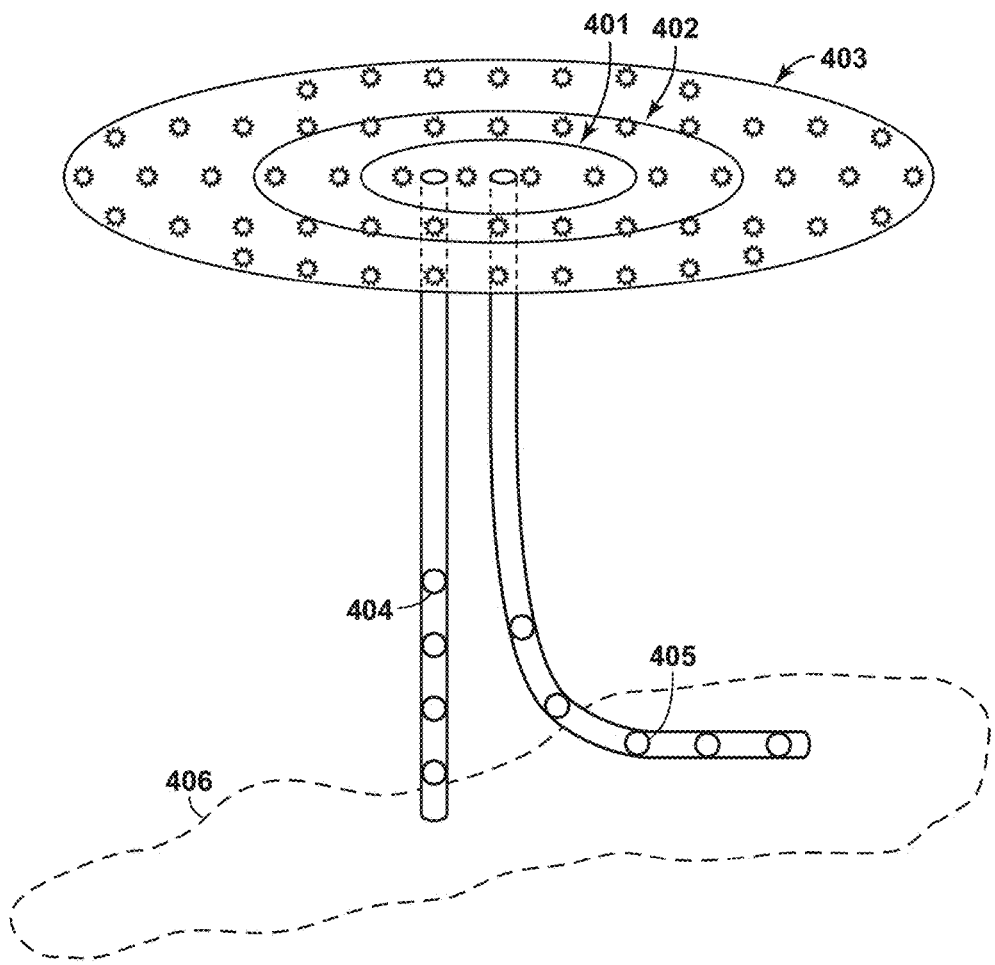
FIG. 3 is a schematic diagram illustrating VSP geometry and candidates for survey design posed as subsets of one another according to the present invention; receivers are shown located in both a vertical well and in a horizontal well typically used in unconventional plays.

The selected acquisition geometry candidates are each characterized by groups of traces that are part of the total number of traces considered, hence the term subset may be used. They preferably are selected and processed by considering increasing areal coverage and cost. For example in a VSP survey, if the business objective is to resolve certain parts of the model, then a possible acquisition question can be: Given the receiver positions in the well, what type of source geometry will help in resolving the target region? FIG. 3 shows both a vertical well and a horizontal well; receivers are indicated by the small circles 404 in the vertical well and 405 in the horizontal well. The shots are near the surface and are indicated by the sunbursts. In this case, one can simulate data over a large region with many sources and invert for the target region 406 by including shots from the oval-shaped sub-regions 401, 402, and 403. At step 306, the benefit of the increasing the number of sources at increasing distance from the well head can be evaluated.

Figure 1A:
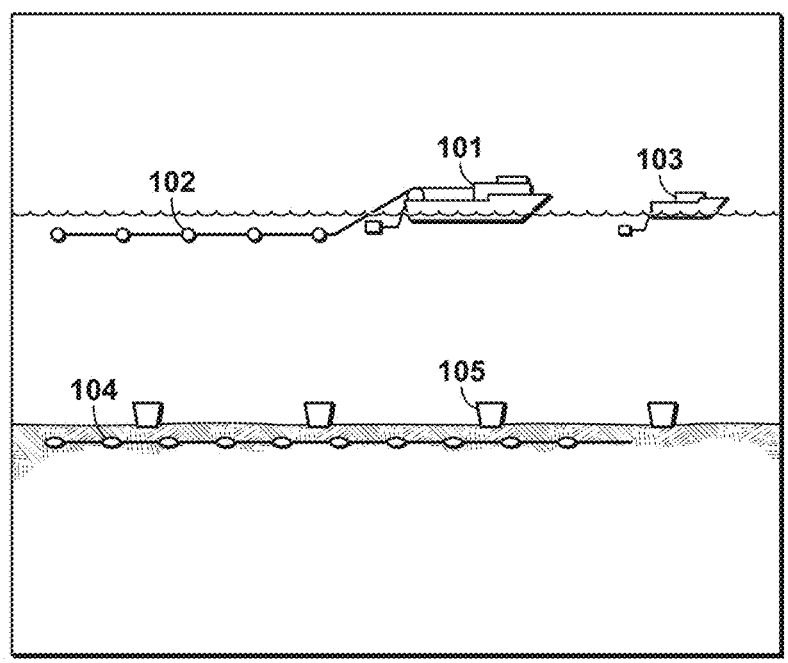
FIGS. 1A-1C illustrate marine seismic acquisition using streamers and ocean-bottom receivers; a profile is shown in FIG. 1A, and a map view showing the receiver patches are shown for streamer (1B) and ocean-bottom (1C) recording.

As an additional example of different areal coverage, FIG. 1A illustrates possible active receiver patches to be considered for a marine acquisition design. These include a marine streamer 102 located near the surface of the ocean, an ocean bottom cable 104, and ocean bottom nodes 105. The streamer and the ocean-bottom cable send signals along connecting cables to a recorder, but the ocean-bottom nodes are autonomous units with their own recording and memory. Also shown in FIG. 1A is tow vessel 101, which pulls both sources and marine streamers, and vessel 103, which deploys only sources. Note that computer simulation of all these receivers (see step 300 in the flow chart FIG. 2) is efficient because with finite-difference simulation there is little increase in cost for simulating extra receivers such as ones both near the surface (marine streamer) and near the ocean bottom (cable or node).

Figure 1B:
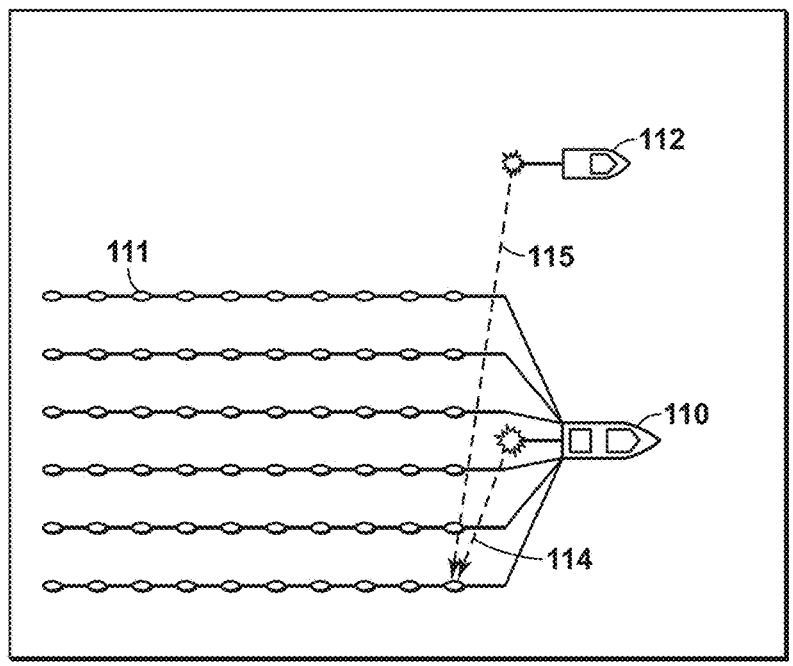
Figure 1C:
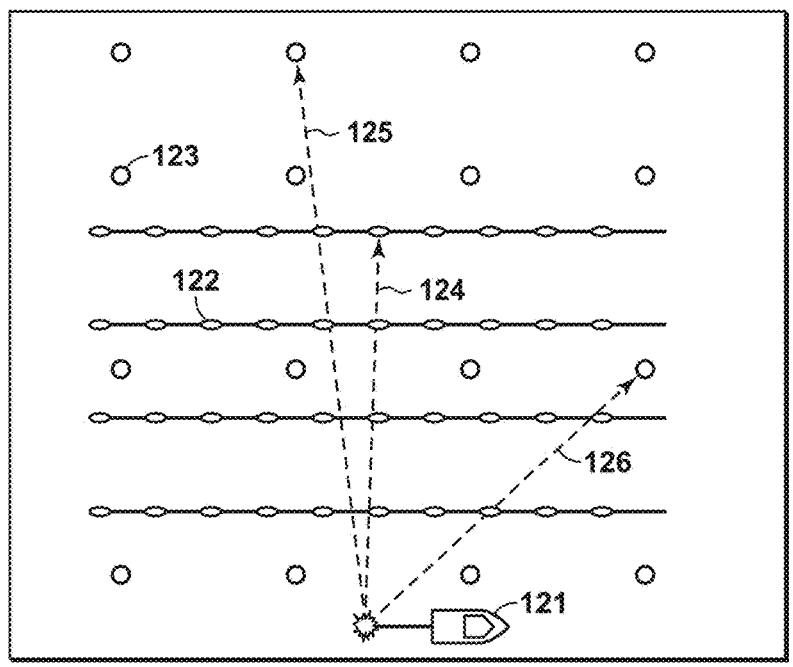

One candidate acquisition geometry might be a "base" survey, typical for the area. For example, shown in the map-view of FIG. 1B is a standard "Narrow Azimuth" (NAZ) streamer survey in which the source from boat 110 fires into 6 streamers 111 pulled behind the boat. Such surveys have good inline sampling along the direction the boat is traveling; typically cable lengths are 6-8 km long and the sensors are spaced at 12.5 m. The Narrow Azimuth survey is not well sampled cross line to the direction of motion. The streamers are typically 100 to 150 m apart, and the cross-line offset (source to receiver distance) is limited as shown by the dashed line 114. By adding an additional source boat 112 to the side of the receiver boat 110, much longer cross line offsets (115) can be recorded. The source from boat 112 may fire alternately with the source on boat 110 (flip-flop); or it may fire "simultaneously" or with a small time shift within the same time window. Such surveys are termed "Wide Azimuth" (WAZ) surveys. The current invention can quantitatively evaluate the value of these increased cross line offsets for a Wide Azimuth survey, e.g. those recorded by boat 112 into streamer 111, compared to the base Narrow Azimuth survey. Additional groups of traces or subsets can be considered by putting receivers on the ocean bottom as shown in FIG. 1C either in cables (122) or nodes (123). Because the ocean-bottom receivers do not need to be pulled behind a boat, much larger source-to-receiver offsets can be recorded. In addition, traces can be recorded for negative offsets, e.g. with receivers in front of the source boat (121) as shown by dashed line 126. Ocean bottom cables have good inline sampling but cross-line offsets are limited (124) because of the limited number of cables and the need to roll them or move them during the survey. In comparison, nodes 123 are deployed more uniformly on a much larger but sparser grid, and source-to-receiver offsets (125) can be 12 km or more. Each scenario in this example corresponds to a change in the effective areal coverage of the survey in terms of more or fewer source-to-receiver offsets at different azimuths. There is no requirement for the present invention that one group of traces be an explicit subset of the other. For example, the NAZ surveys as shown in FIG. 1B may have finer inline source intervals than the WAZ survey. There is also no requirement that all data for a given acquisition geometry are recorded at the same time. For example, an ocean-bottom node survey may be recorded in the same location as a NAZ streamer survey but at a different time. (Sometimes, two such surveys are processed together and used jointly to image the earth even if they are acquired at different times.) The present invention could be used, for example, to determine whether or not a new ocean-bottom survey would provide value over a previously acquired NAZ streamer survey.

Use of Quantitative Measures Relative to the Reference Model

The value of the additional data traces or wider areal coverage is a quantitative determination made using one or more statistics based on the reference model. Note that the cost function used in the inversion steps 303 and 304 uses a data-based cost function, e.g. the simulated data computed from the latest updated model is compared to the "true" simulated data based on the reference function. In step 306, the comparison is done relative to the models themselves. A number of statistics comparing the model can be generated. The simplest one is to subtract the two models to make a difference model. In addition, a mathematical operator can be applied to the models before the subtraction. Examples of mathematical operations include scaling the models, removing a drift or trend with depth, and filtering by frequency. In addition, an operation can include transforming the models into a different domain; for example by applying a Fourier transform, FK-transform, radon transform or curvelet transform. Further operators can include applying a time or depth derivative of the models to produce a reflectivity version of the model emphasizing layer boundaries similar to a seismic section. A quantitative measure could involve computing correlation or coherence between the reference and output model. For example, the depth error between the models could be quantified by the value of the lags in the cross correlation function between the final output model and the reference model. Persons who work in the technical field will be able to think of other quantitative majors. All such measures are included within the scope of the present invention. In addition to comparing the final output model and reference model, the comparison can involve a statistic related to how the match with the reference model changes with iterations of the inversion. Finally, the velocity models obtained from FWI analysis can then be used to compute an image of the target as would be generated by conventional processing, and these images can be compared.

One particular quantitative measure involves computing the volume of investigation. Depending on the acquisition geometry, each survey will have a certain region of influence in the model domain. That is, certain parts of the model will be sensitive to the data. For example, surveys with longer offsets will have better chance of illuminating the deeper parts of the subsurface compared to surveys with shorter offsets. Often the design considerations of a survey that provides better illumination compared to other surveys typically will result in more cost. The information value in acquiring well designed survey compared to others can be quantified using a metric such as the one called volume of investigation ("VOI"). To determine VOI proposed by Miller and Routh [27] and Oldenborger et al. [26], two inverse problems need to be solved using two different starting models $m_1^{start}$ and $m_2^{start}$. In the region where the data are sensitive to the model, the two inverted models $m_1^{inverted}$; $m_2^{inverted}$ will be similar, and in the region where data are not sensitive to the model, the inverted models will revert back to starting models. VOI is then defined as the ratio of $(m_1^{inverted}-m_2^{inverted})/(m_1^{start}-m_2^{start})$. In the region of "good" illumination, and in VOI will be close zero and in the region of "poor" illumination VOI will be close to unity. Therefore when different surveys are compared with respect to their illuminating capacity, VOI can be used as a direct metric to provide how information is gained by choosing one survey over the other. As a non-limiting example of how VOI may be used as a constraint on inversion, consider that we have survey A and we determine the VOI (i.e., the model region where survey A has an influence). When we consider survey B, we can use the inverted model from survey A as a starting model along with the VOI for Survey A. We pose the inverse problem for Survey B by not allowing the model to be updated in the VOI defined by survey A, thereby constraining the updates to occur only outside the VOI of survey A. Therefore if survey B updates the model outside of the VOI of survey A, then it is bringing extra information compared to survey A.

Efficiency Improvement: Cascaded Workflow

An objective of the current invention is to determine when the value added from additional coverage reaches a point of diminishing returns. This can be determined efficiently by using a cascaded workflow. With the cascaded workflow, the final inverted model for an acquisition geometry subset with smaller areal coverage is used as the starting model for the iterative inversion on a subset with greater areal coverage, as shown as path 314 in the FIG. 2 flow chart. In this case, the ability of the extra coverage to change the results relative to the smaller survey is determined. In other words, the invention answers the question of whether the increased coverage provided by a more costly scenario adds commensurate value.

Figure 2:
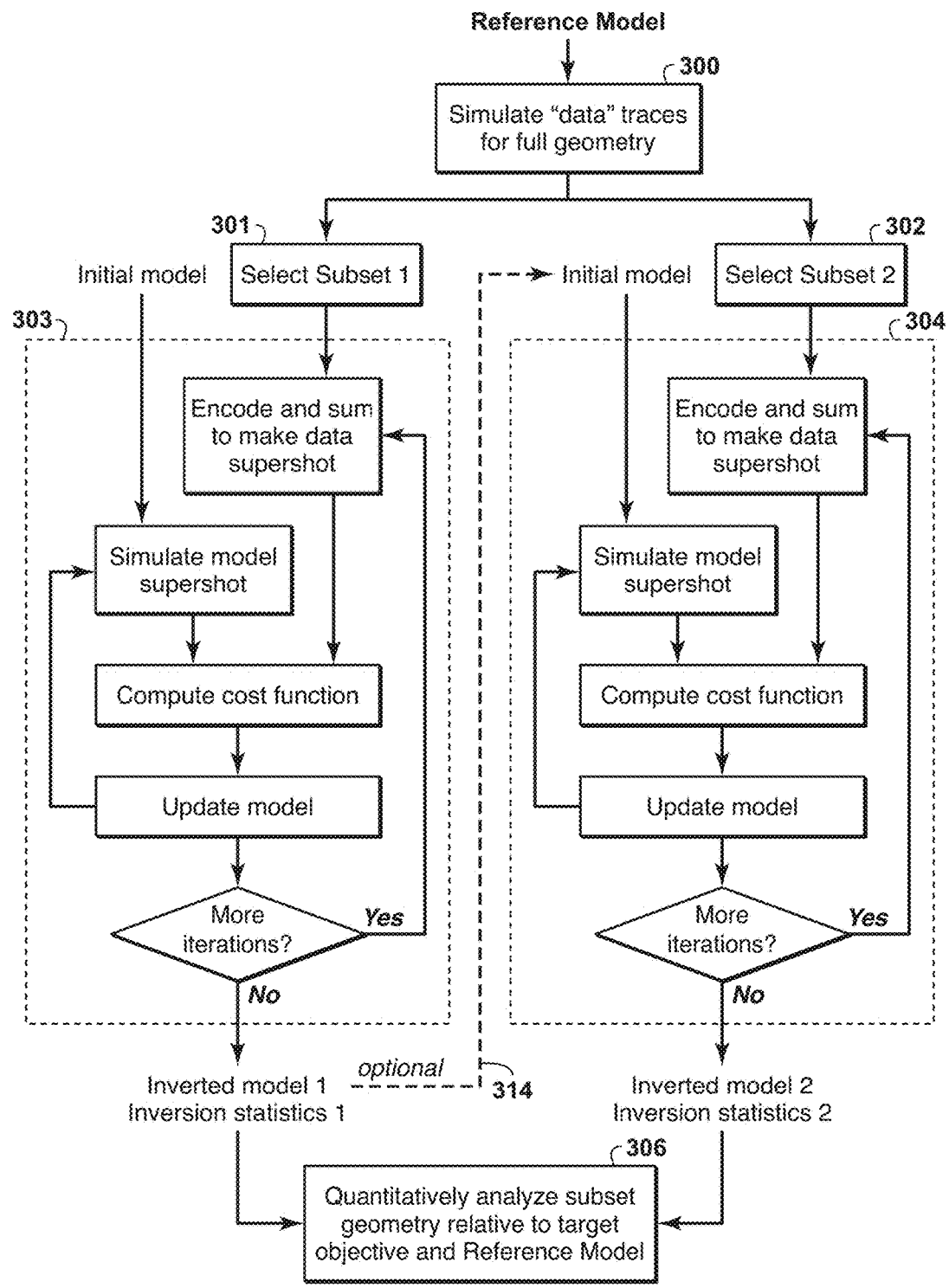
FIG. 2 is a flow chart showing basic steps in one embodiment of the present inventive method for comparing different subset geometries; the box for each subset corresponds to an ESSFWI engine.

Depending on how many acquisition geometries need to be investigated for a chosen model, the workflow can be designed starting with the acquisition geometry that has the least coverage, for example narrow azimuth, and progress to the one with largest, for example wide azimuth. FIG. 1 and FIG. 3 illustrate how one acquisition geometry can be a subset of another. These subsets can be separately inverted and the result evaluated quantitatively as shown in FIG. 2. If acquisition geometry 1 is a subset of another, then the final model from the first acquisition can used as a starting (initial) model for the next one; this will speed up the process. Whether or not the various geometry candidates can be regarded as subsets of one another, they will differ in terms of areal coverage. This is what is meant by different acquisition geometries. Inevitably, increased areal coverage comes at an increased cost for performing the actual survey. In general, depending on the similarity of two geometries being considered, the final model from the first, smaller-coverage geometry can used as a starting model for the larger-coverage one to speed up the FWI (fewer iterations) for the larger-coverage geometry.

As has been stated, it is often advantageous to process the data subsets starting with the smallest areal coverage and progressing to the next larger areal coverage, using the final model from one as the starting model for the next. It may be thought that a similar speed up could be obtained by processing the data subsets in the reverse order. However, a concern about the starting model in a non-unique process such as inversion is that the starting level preferably is neither too bad nor too good. If it is too bad, i.e. too far off the true subsurface model, many more iteration cycles will be needed for convergence, and possibly it will converge to a local minimum of the objective function, giving a wrong final model. However, the initial model can also be too good. For example, in the present invention, we know the true model and could use that as a starting model. This would not be advisable, however, because the successive iterations would likely not alter such a starting model very much for any acquisition geometry being evaluated. Thus it is better to proceed from less accurate to more accurate i.e. less areal coverage to more areal coverage, when using the final model as the initial model for the next acquisition geometry to be evaluated.

Often in the acquisition design stage, there is need to explore the sensitivity of the survey geometry to different geological scenarios. For example, in a particular region there can be several different geological hypotheses, and each will lead to a different reference model. Although each of these different reference velocity models requires a separate simulation, the inversion could be solved efficiently if these models are variations from a base case such that the prior information (i.e., the velocity model) from previous inversion can be used for subsequent inversions. This can be performed by a variation of process described in FIG. 2 in which steps 303-304 can be performed with different reference models instead of different geometries. Each change of reference model will require a new simulation step 300. The initial model for subsequent tests can be based on the results from the first model in the same method described above for comparison of different geometry subsets. For example, if the shape of the base of a salt structure is uncertain, then two or more models can be developed with different shapes for the base of salt interface. The inversion process is completed with one model starting with a smooth initial velocity model. Then for the subsequent models, initial models are constructed using the results from the prior inversions for the region above the salt and a smooth version below the top of the salt. In this way, the inversion is faster because the region above the salt is already determined for a specific geometry.

The cascaded approach of using the output from one survey as starting point for inversion of another, or (as described in the preceding paragraph) using the output from one scenario as starting point for a different scenario, is general and applicable to any survey(s). However, depending on the objective, the survey design question can be very specific. Consider the VSP example shown in FIG. 3. The ovals 401, 402, and 403 indicate the regions from which shots are used to provide the data to invert. Depending on the target region, the survey design problem can be posed by progressively including more shots to investigate the influence on the target resolution. One can either go from outside-in or inside-out. If outside-in, then in the first stage all shots are used and the best possible model is obtained. In the next step, the shot coverage may be progressively reduced to determine what is the least amount of shots needed to obtain an image of quality similar to the previous case. (However, for reasons discussed previously, when going from outside-in, it may not be advantageous to use the final model from a larger aerial coverage as the starting model for a smaller area coverage.)

For a 4D (time lapse) problem, the goal is often target oriented. Given a base model from FWI, the FWI engine can be used to design the type of monitor survey data coverage needed to resolve the target region. Depending on the specific question(s) posed by the production plan and history (saturation change, pressure change, water sweep, gas-exosolution), the monitor survey needs to be carefully designed. Since FWI works in the model domain, the strict requirement of occupying the same location as the base survey can be relaxed somewhat in the monitor survey design. The base FWI model can be used as starting model, and monitor acquisition parameters can be designed to provide the desired information in the target zone.

Efficiency Improvement with Simultaneous-Source FWI

To mitigate the computer time required to carry out imaging with several models and for several different geometries, the present disclosure preferably uses encoded simultaneous-source full-wavefield inversion (ESSFWI) or randomized sequential FWI to solve this problem. The main goal is to determine which geometry can "best" resolve the velocity model. To apply ESSFWI for moving spread data, e.g. marine streamer or rolling ocean-bottom cable, the cross-correlation objective function (Routh, et al. [18]) may be used with several realizations to handle such geometries efficiently, meaning that the output can be recovered with a smaller number of iterations. A key idea is that ESSFWI or random sequential FWI can provide velocity information crucial for imaging, and computationally they are fast so they can handle several different models, and for each model query the optimal geometry.

Each box 303 and 304 represents a full-wavefield inversion process to infer a subsurface velocity model. Each process starts with an assumed "initial model" and uses a subset of the data traces from 300 to solve for an updated subsurface model. As stated above, the full wavefield inversion is preferably performed as simultaneous encoded-source iterative inversion, meaning that multiple source (or receiver) locations are inverted simultaneously using source encoding as described in Krebs et al. [17]. This is not necessary at all for the invention to work, but it is a very significant speed-up consideration, which is particularly important in a design study where perhaps many geometry candidates are being evaluated, and especially for inversion of large 3D data sets. Simultaneous-source inversion is preferable to use in the invention even if this inversion technique will not be used to process the actual survey data. This highly efficient type of inversion may be conducted either by ESSFWI or by or randomized sequential FWI, as those techniques are known in the technical field and defined herein, it being understood that for purposes of this document that randomized sequential FWI is considered to be merely a particular and mathematically equivalent way of conducting simultaneous encoded-source inversion. In each simulation loop 303 and 304, seismic data are simulated, using the initial or then current model, only for source and receiver locations present in the particular geometry subset 301 or 302, as the case may be. Similarly, to compute the cost function, the "measured" data are obtained from the values generated at step 300 for those same source and receiver locations.

When simultaneous source inversion is used, additional considerations come into play when the selected geometry is not a "fixed spread" geometry with every receiver location listening to every source excitation. Such geometries include standard marine streamer surveys, in which the receivers are towed behind the source vessel, and land or ocean-bottom surveys with rolling spreads, in which the receiver lines are picked up and redeployed as the source moves through the survey area. As discussed in paragraphs 45 and 46, simultaneous source inversion is problematic for non-fixed spread geometries. In this case any of the mitigation methods discussed in paragraph 46 may be employed. It is not necessary, that the method be the same method as will be used on the field data. The method of Routh [18], which uses the cross-correlation cost function, is a preferred (but not essential) choice not only because of its effectiveness in mitigating the effect in the measured data of non-listening receivers, but also because it can sometimes be expected to converge faster to the right answer, and it makes more use of the kinematics (phase) and less of the dynamics (amplitudes) of the wavefield—which is favorable for the present technical problem of finding a velocity model. Because of these benefits, the cross-correlation cost function may have advantages, even when the geometry is a fixed spread geometry.

Comparing the present inventive method to, for example, the publication by Baptiste et al. [12], the latter do not use the methods of the present invention to speed up the inversion and analysis (e.g., simultaneous-source techniques), and they do not utilize the results of the inversion for one geometry in the computation for the second geometry. Also, they do not use a quantitative measure relative to the geological model as is done in the current invention. Instead, their choice of an acquisition geometry is based on a qualitative comparison of two images and a subjective judgment as to which looks better.

Example

Figure 4A:
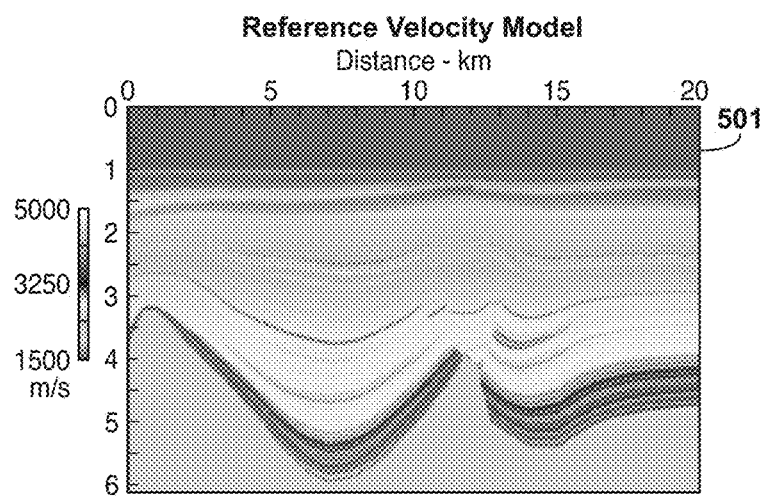
FIGS. 4A-4C illustrate a test example of the present inventive method used to compare two fixed-spread geometries, one having streamer geometry (4B) and the other OBC geometry (4C), where a realistic velocity model (4A) is used to generate the synthetic data.
Figure 4B:
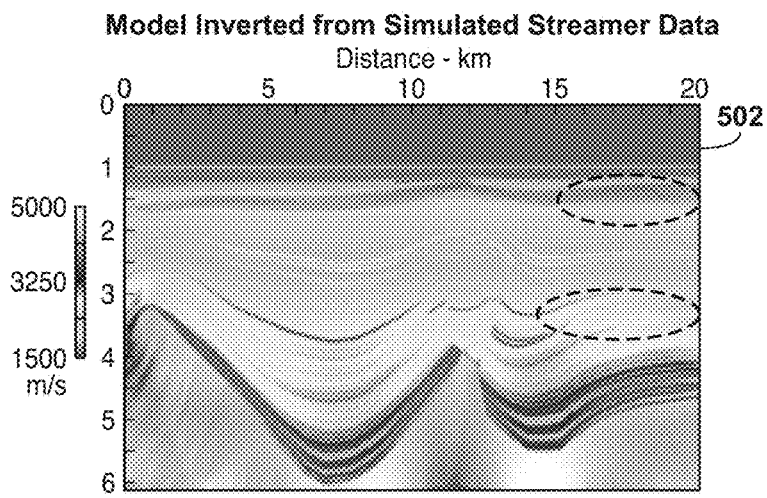
Figure 4C:
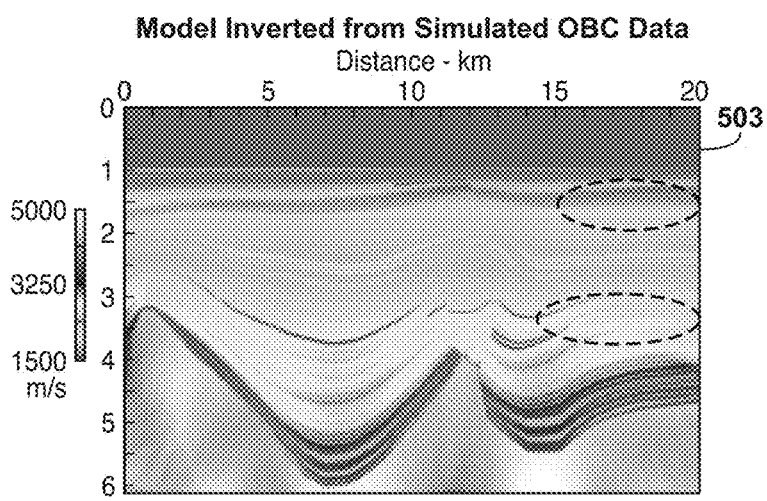
Figure 5A:
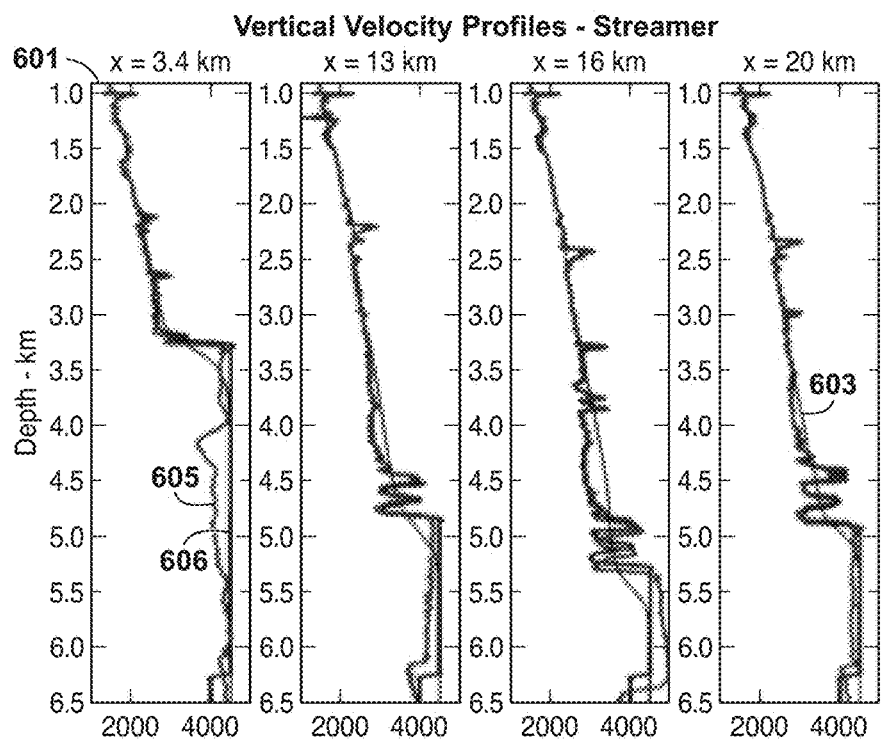
FIGS. 5A-5B show vertical velocity profiles equivalent to a well log obtained from the FIGS. 4B-4C results comparing fixed receiver streamer (5A) versus fixed receiver OBC geometry (5B)

The example described below is generated using the present inventive method, as described in the flow chart FIG. 2. The example compares two survey designs, streamer and OBC surveys in a marine setting and compares the inverted model using both data sets. The inverted model and corresponding well-logs (vertical profiles extracted from the inverted models at different horizontal positions) are compared in FIGS. 4A-4C and 5A-5B. FIG. 4A shows the true (reference) velocity model 501, FIG. 4B shows the model inverted from the receiver streamer data 502, and FIG. 4C shows the model inverted from the ocean bottom cable data 503. (Due to patent law restrictions on the use of color, FIG. 4 is a black-and-white reproduction of original color drawings.) FIGS. 5A (streamer) and 5B (OBC) show comparisons at specific horizontal locations of the vertical profiles in velocity, similar to a well log, between the true (reference) model 606 and 608 and inverted models 605 and 607, respectively. 603 is the well log for the initial model, 502.

Figure 5B:
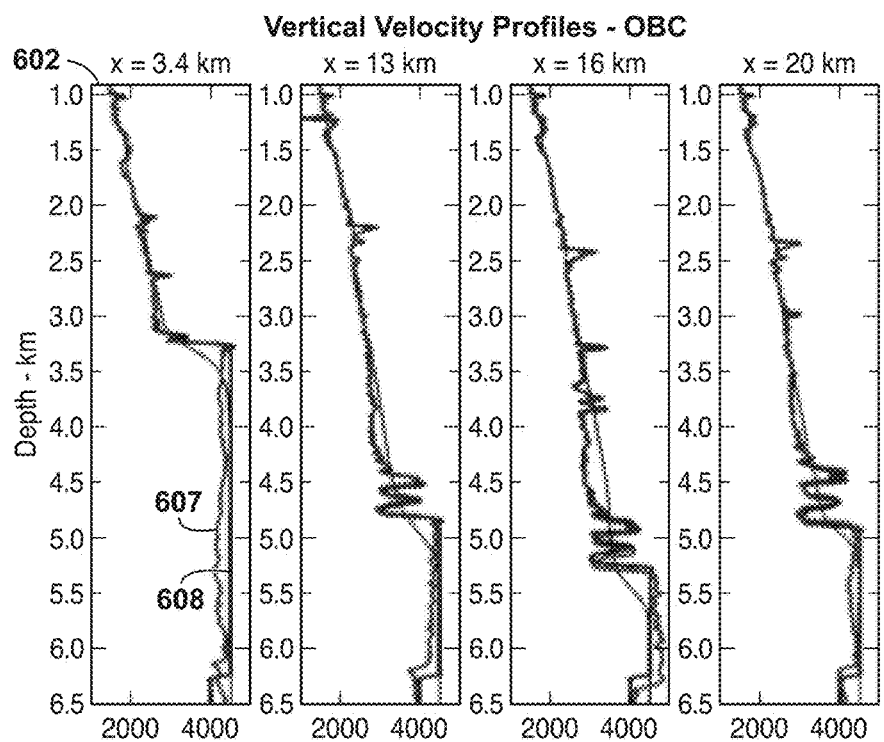

The OBC inversion clearly shows improvement particularly in salt; see the regions within the ovals in FIGS. 4B and 4C. FIGS. 5A and 5B show that the OBC inversion is a better match to the reference. With the comparison now reduced to FIGS. 5A-5B by using the present inventive method, any number of quantitative measures can be defined to compare the two candidate acquisition geometries as described previously. One quantitative measure is the VOI measure described in a previous paragraph. Other examples include, without limitation, computing the difference between the final and reference model or the rate of change in that difference with iterations.

Figure 6A:
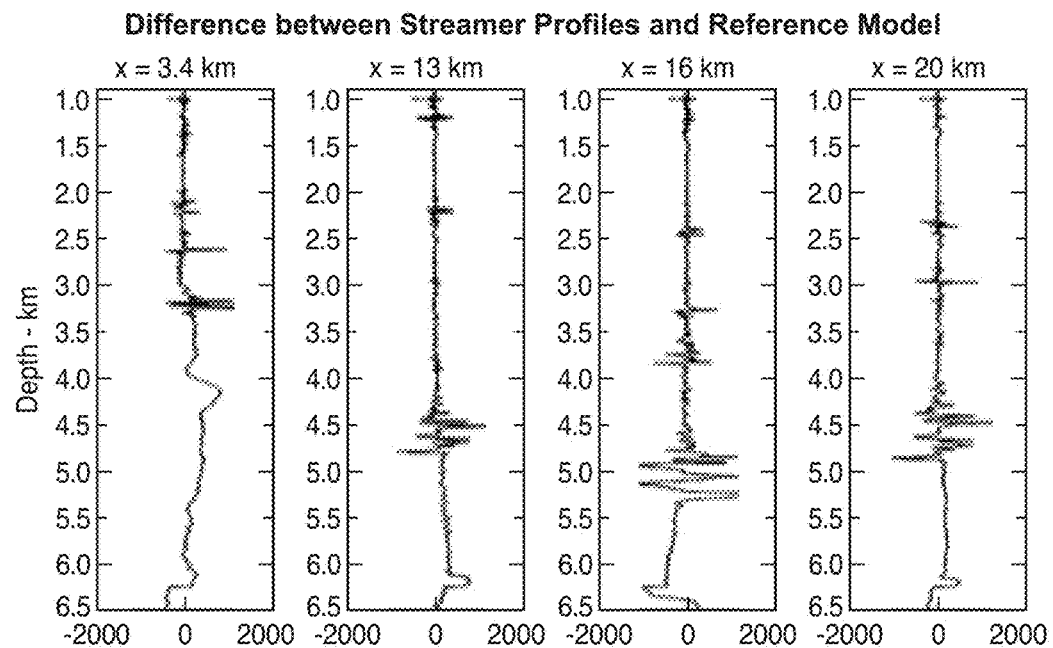
FIGS. 6A-6B plot the arithmetic difference from the reference velocity model of FIG. 4A for the steamer velocity profiles (6A) and the OBC velocity profiles (6B).
Figure 6B:
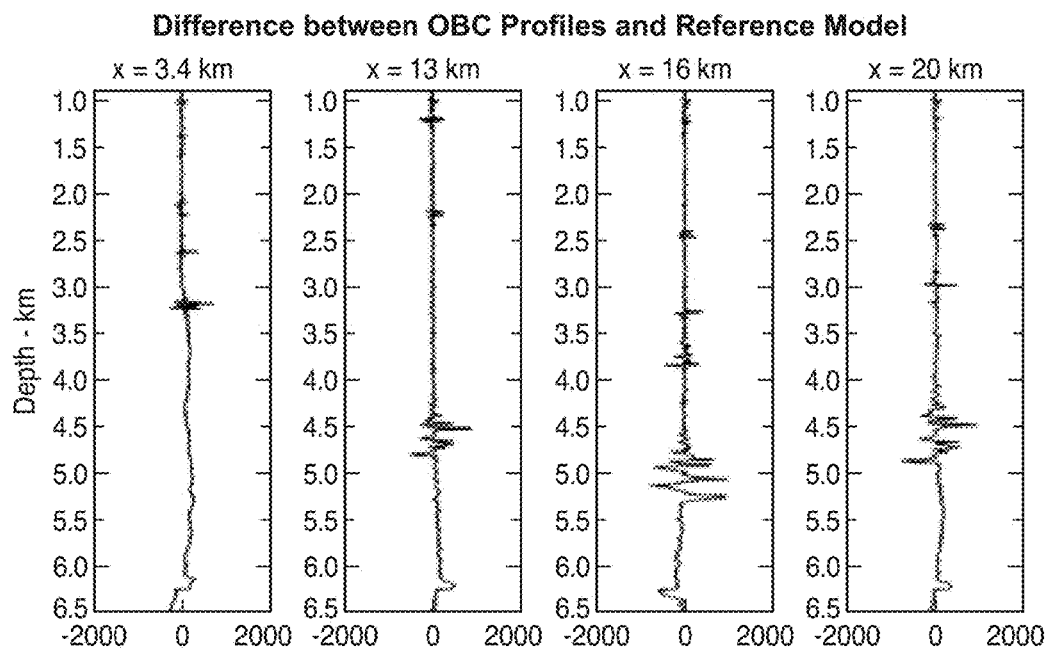

The arithmetic difference measure is plotted and shown in FIG. 6A (streamer) and FIG. 6B (OBC). These plots quantify the added value of the OBC geometry compared to the streamer geometry.

The foregoing description is directed to particular embodiments of the present invention for the purpose of illustrating it. It will be apparent, however, to one skilled in the art, that many modifications and variations to the embodiments described herein are possible. All such modifications and variations are intended to be within the scope of the present invention, as defined by the appended claims.

REFERENCES (All references are incorporated herein in all jurisdictions that allow it.)

1. Maurer, H., Curtis, A., and Boerner, D. E., "Recent advances in optimized geophysical survey design," Geophysics, 75, A177-A194 (2010).
2. Maurer, H. R., and D. E. Boerner, "Optimized design of geophysical experiments", The Leading Edge, 17, 1119 (1998).
3. Coles, D., and F. Morgan, "A method of fast, sequential experimental design for linearized geophysical inverse problems", Geophysical Journal International, 178, 145-158 (2009).
4. Curtis, A., "Optimal design of focused experiments and surveys", Geophysical Journal International, 139, no. 1, 205-215. (1999).
5. Curtis, A., "Optimal experiment design: Cross-borehole tomographic examples", Geophysical Journal International, 136, no. 3, 637-650 (1999).
6. Curtis, A., "Theory of model-based geophysical survey and experimental design, PartA: Linear problems", The Leading Edge, 23, 997-1004 (2004).
7. Curtis, A., "Theory of model-based geophysical survey and experimental design, Part B: Nonlinear problems", The Leading Edge, 23, 1112-1117 (2004).
8. Ajo-Franklin, J., "Optimal experiment design for time-lapse travel time tomography", Geophysics, 74, no. 4, Q27-Q40 (2009)
9. Haber, E., L. Horesh, and L. Tenorio, "Numerical methods for experimental design of large-scale linear ill-posed inverse problems," Inverse Problems, 24, 055012, (2008).
10. Routh, P. S., G. A. Oldenborger, and D. W. Oldenburg, "Optimal survey design using the point spread function measure of resolution," 75$^{th}$ Annual International Meeting, SEG, Expanded Abstracts, 1033-1036 (2005).
11. Oldenborger, G. A., and P. S. Routh, "The point spread function measure of resolution for the 3-D electrical resistivity experiment", Geophysical Journal International, 176, 405-414 (2009).
12. Baptiste et al., "Changing OBC Acquisition geometry using FWI," 74$^{th}$ EAGE Conference and Exhibition, W028 (2012)
13. Tarantola, A., "Inversion of seismic reflection data in the acoustic approximation," Geophysics 49, 1259-1266 (1984).
14. Sirgue, L., and Pratt G. "Efficient waveform inversion and imaging: A strategy for selecting temporal frequencies," Geophysics 69, 231-248 (2004).
15. Fallat, M. R., Dosso, S. E., "Geoacoustic inversion via local, global, and hybrid algorithms," Journal of the Acoustical Society of America 105, 3219-3230 (1999).
16. Hinkley, D. and Krebs, J., "Gradient computation for simultaneous source inversion," PCT Patent Application Publication No. WO 2009/117174.
17. Krebs, J. R., Anderson, J. A., Neelamani, R., Hinkley, D., Jing, C., Dickens, T., Krohn, C., Traynin, P., "Iterative inversion of data from simultaneous geophysical sources," U.S. Pat. No. 8,121,823.
18. Routh et al., "Simultaneous source inversion for marine streamer data with cross-correlation objective function," U.S. Pat. No. 8,688,381.
19. Van Manen, D. J., Robertsson, J. O. A., Curtis, A., "Making wave by time reversal," SEG International Exposition and 75$^{th}$ Annual Meeting Expanded Abstracts, 1763-1766 (2005).
20. Berkhout, A. J., "Areal shot record technology," Journal of Seismic Exploration 1, 251-264 (1992).
21. Zhang, Y., Sun, J., Notfors, C., Gray, S. H., Cherris, L., Young, J., "Delayed-shot 3D depth migration," Geophysics 70, E21-E28 (2005).
22. Van Riel, P., and Hendrik, W. J. D., "Method of estimating elastic and compositional parameters from seismic and echo-acoustic data," U.S. Pat. No. 6,876,928 (2005).
23. Mora, P., "Nonlinear two-dimensional elastic inversion of multi-offset seismic data," Geophysics 52, 1211-1228 (1987).
24. Ober, C. C., Romero, L. A., Ghiglia, D. C., "Method of Migrating Seismic Records," U.S. Pat. No. 6,021,094 (2000).
25. Ikelle, L. T., "Multi-shooting approach to seismic modeling and acquisition," U.S. Pat. No. 6,327,537 (2001).
26. Oldenborger, G., Routh, P., and Knoll, M., "Model reliability for 3D electrical resistivity tomography: Application of the volume of investigation index to a time-lapse monitoring experiment." Geophysics 72(4), F167-F175 (2007).
27. Miller, C. R., and Routh, P. S., "Resolution analysis of geophysical images: Comparison between point spread function and region of data influence measures", Geophysical Prospecting 55, No. 6, 835-852 (2007).
28. Regone, Carl J., "Using 3D finite-difference modeling to design wide-azimuth surveys for improved subsalt imaging," Geophysics 72(5), SM231-SM239 (2007).
29. L'Heureux, Elizabeth, Lombard, Art, and Lyon, Thomas, "Finite-difference modeling for acquisition design of an ocean-bottom seismic survey," SEG Technical Program Expanded Abstracts doi: 10.1190/segam2012-1157.1, 1-5 (2012).
30. Campbell, S. B., "Targeted Geophysical Survey", U.S. Pat. No. 7,689,396 B2.
31. Bernitsas, Nikolaos, "Subsurface Illumination, a hybrid wave equation ray tracing method," International patent publication WO 2004/025326 A2.
32. Veldhizen, E. J., Blacquiere, G., and Berkhout, A. J., "Acquisition geometry analysis in complex 3D media," Geophysics 73, No. 5, Q43-Q57 (2008).
33. Cao, J. Brewer, J., Mosher, C. C., Eick, P. M., "Reciprocal Method two-way wave equation targeted data selec- 34. Rekdal, T. R., Day, A., Strand, C., "Method for determination of sufficient acquisition coverage for a marine seismic streamer survey," U.S. Pat. No. 7,336,560.
35. Routh, Partha S., Marcinkovich, Carey M., Lazaratos, Spyridon K., Lee, Sunwoong, Krebs, Jerome R., "Hybrid Method for Full Wavefield Inversion Using Simultaneous and Sequential Source Method," U.S. Pat. No. 8,437,998.
36. Routh, Partha S., Lee, Sunwoong, Neelamani, Ramesh, Krebs, Jerome R., Marcinkovich, Carey M., Lazaratos, Spyridon K., "Simultaneous Source Encoding and Source Separation as a Practical Solution for Full Wavefield Inversion," U.S. Pat. No. 8,775,143.
37. Krebs, J. R., Cha, Y. H., Lee, S., Dimitrov, P., Mullur, A. A., Downey, N., Routh, Partha S., "Orthogonal Source and Receiver Encoding," U.S. Patent Application Publication No. 2013/0238246.

The invention claimed is:

1. A method for evaluating seismic survey acquisition geometries, said acquisition geometries specifying source and receiver locations, said method comprising:

proposing two or more different acquisition geometries to evaluate;

assuming a subsurface reference model of velocity or other physical property, simulating, using a computer, synthetic measured seismic data corresponding to all source and receiver locations in the two or more acquisition geometries;

for each selected acquisition geometry, selecting from the synthetic measured seismic data those data corresponding to the source and receiver locations present in the selected acquisition geometry, and inverting the selected synthetic measured data by iterative, numerical inversion, using the computer, to obtain a final updated subsurface model;

comparing the final updated model for each proposed acquisition geometry to the reference model using a selected quantitative measure of agreement with the reference model, then selecting an acquisition geometry by balancing a high quantitative measure of agreement with a low survey cost;

carrying out a survey designed according to the selected acquisition geometry;

wherein the two or more acquisition geometries are ranked in order of areal coverage, and the iterative numerical inversions are performed in order of smallest areal coverage to largest areal coverage, and the final updated model from the first inversion is used as a starting guess for the model for the second inversion, and wherein the iterative numerical inversion of the selected synthetic measured seismic data comprises selecting a starting model, then using the starting model to simulate predicted data, then quantitatively measuring degree of misfit between the predicted data and the synthetic measured data, then updating the starting model to reduce the degree of misfit, and repeating for a next iteration using the updated model.

2. The method of claim 1, wherein the two or more selected acquisition geometries have a same receiver spacing and source-shot spacing, and a same range of source-receiver offsets.

3. The method of claim 1, wherein the degree of misfit is quantitatively measured by a cross-correlation cost function.

4. The method of claim 1, wherein the selected quantitative measure of agreement incorporates at least one of volume of investigation, accuracy of a final updated model, less misfit between the predicted data and the synthetic measured data, and rate of change in misfit improvement with iterations.

5. The method of claim 1, wherein in the iterative, numerical inversion, a plurality of sources, or alternatively a plurality of receivers using source-receiver reciprocity, are encoded and inverted simultaneously with a single simulation to generate the predicted data.

6. The method of claim 5, wherein the plurality of encoded sources are summed to form a composite gather, and the composite gather is simulated in the single simulation wherein predicted data are simulated for every receiver location in the composite gather.

7. The method of claim 6, wherein at least one of the selected acquisition geometries involves some receiver locations that do not record some of the source excitations, and a cross-correlation cross function is used to measure the degree of misfit between the predicted data and the synthetic measured data.

8. The method of claim 1, wherein the starting model is determined using a final model from a prior inversion with a different acquisition geometry or with a different reference model.

9. The method of claim 1, wherein the selected quantitative measure incorporates volume of investigation, and the starting model is $mi^{start}$ and the updated model is $mli^{nvert}$, then further comprising repeating the inversion with a second starting model $m2^{start}$ to obtain a corresponding updated model $m_2i^{nvert}$, wherein the volume of investigation is computed as the ratio $(miinve-m_2in"vert)|(mistart-m_2start)$.

10. The method of claim 1, further comprising estimating a relative cost of performing a survey using each proposed acquisition geometry.

11. The method of claim 1, wherein the two or more different acquisition geometries are different because of a difference in one or more of: source or receiver locations, source or receiver components, source or receiver density, source-to-receiver offsets and source-to-receiver azimuths.

12. The method of claim 1, wherein the acquisition geometries are for a 3D survey, and the iterative, numerical inversion is full wavefield inversion.

13. The method of claim 1, wherein the two or more acquisition geometries can be ranked in order of number of seismic traces that would be generated, from smallest to largest, and each acquisition geometry includes all traces present in all smaller acquisition geometries, plus at least one more, wherein a trace is defined by a particular source location and receiver location.

14. The method of claim 1, further comprising prospecting for hydrocarbons using the results of the survey carried out.

* * * * *